US010861936B2

(12) United States Patent
Liaw

(10) Patent No.: US 10,861,936 B2
(45) Date of Patent: Dec. 8, 2020

(54) FIN-LIKE FIELD EFFECT TRANSISTORS HAVING HIGH MOBILITY STRAINED CHANNELS AND METHODS OF FABRICATION THEREOF

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/262,507

(22) Filed: Jan. 30, 2019

(65) Prior Publication Data

US 2020/0058739 A1 Feb. 20, 2020

Related U.S. Application Data

(60) Provisional application No. 62/764,807, filed on Aug. 15, 2018.

(51) Int. Cl.

| | |
|---|---|
| ***H01L 29/10*** | (2006.01) |
| ***H01L 29/16*** | (2006.01) |
| ***H01L 29/66*** | (2006.01) |
| ***H01L 29/78*** | (2006.01) |
| ***H01L 29/06*** | (2006.01) |

(Continued)

(52) U.S. Cl.

CPC .... *H01L 29/1054* (2013.01); *H01L 21/02362* (2013.01); *H01L 21/31144* (2013.01); *H01L 21/823807* (2013.01); *H01L 21/823814* (2013.01); *H01L 21/823821* (2013.01); *H01L 21/823828* (2013.01); *H01L 21/823878* (2013.01); *H01L 27/0928* (2013.01); *H01L 29/0649* (2013.01); *H01L 29/16* (2013.01); *H01L 29/66545* (2013.01); *H01L 29/66795* (2013.01); *H01L 29/785* (2013.01)

(58) Field of Classification Search

CPC ..... H01L 21/823821; H01L 21/823828; H01L 21/823878; H01L 27/0928; H01L 29/0649; H01L 29/16; H01L 29/66545; H01L 29/66795; H01L 29/785

See application file for complete search history.

(56) References Cited

U.S. PATENT DOCUMENTS 8,729,634 B2 5/2014 Shen et al.
2019/0348415 A1 * 11/2019 Sung ............... H01L 21/823418

* cited by examiner

*Primary Examiner* — Seahvosh Nikmanesh
(74) *Attorney, Agent, or Firm* — Haynes and Boone, LLP

(57) ABSTRACT

Fin-like field effect transistors (FinFETs) having high mobility strained channels and methods of fabrication thereof are disclosed herein. An exemplary method includes forming a first silicon fin in a first type FinFET device region and a second silicon fin in a second type FinFET device region. First epitaxial source/drain features and second epitaxial source/drain features are formed respectively over first source/drain regions of the first silicon fin second source/drain regions of the second silicon fin. A gate replacement process is performed to form a gate structure over a first channel region of the first silicon fin and a second channel region of the second silicon fin. During the gate replacement process, a masking layer covers the second channel region of the second silicon fin when a silicon germanium channel capping layer is formed over the first channel region of the first silicon fin.

20 Claims, 13 Drawing Sheets

(51) Int. Cl.

| | |
|---|---|
| ***H01L 21/8238*** | (2006.01) |
| ***H01L 21/02*** | (2006.01) |
| ***H01L 21/311*** | (2006.01) |
| ***H01L 27/092*** | (2006.01) |

FIN-LIKE FIELD EFFECT TRANSISTORS HAVING HIGH MOBILITY STRAINED CHANNELS AND METHODS OF FABRICATION THEREOF

This is a non-provisional application of and claims benefit of U.S. Provisional Patent Application Ser. No. 62/764,807, filed Aug. 15, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes, various channel materials and/or configurations of channel materials have been explored to obtain high mobility strained channels for FinFETs. It has been observed that processing performed after forming the high mobility strained channels can adversely affect strain and/or desired characteristics achieved by such channel materials and/or configurations. Accordingly, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-11A are top views of a FinFET device, in portion or entirety, at various fabrication stages of a method, such as the method of FIG. 1, according to various aspects of the present disclosure.

FIGS. 2B-11B are fragmentary cross-sectional views of the FinFET device along line B-B of FIGS. 2A-11A according to various aspects of the present disclosure.

DETAILED DESCRIPTION

Figure 1:
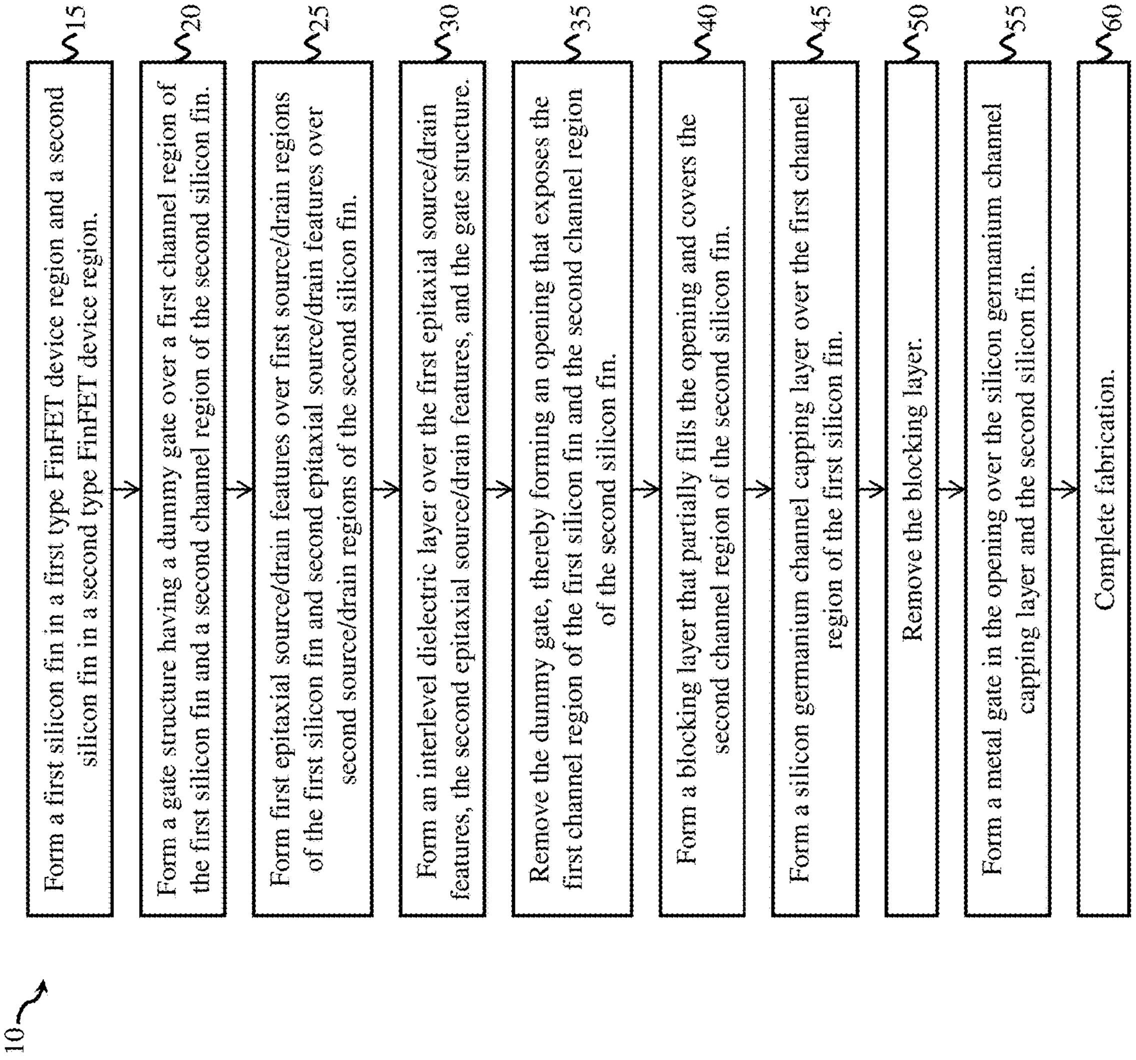
FIG. 1 is a flow chart of a method for fabricating an integrated circuit device according to various aspects of the present disclosure.

The present disclosure relates generally to integrated circuit (IC) devices, and more particularly, to fin-like field effect transistor (FinFET) devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FinFETs (also referred to as non-planar transistors) have become popular and promising candidates for high performance and low leakage applications. FinFETs have been observed to increase drive currents while occupying significantly less IC chip area. As FinFET technologies progress towards smaller IC technology nodes, narrower (thinner) fin widths have been implemented to reduce short channel effects, thereby improving FinFET performance (for example, by reducing a ratio ($I_{on}/I_{off}$) of on-current ($I_{on}$) to off-current ($I_{off}$) and/or drain induced barrier lowering (DIBL)). However, narrower fin widths present challenges for complementary FinFET devices, which typically include a p-type FinFET and an n-type FinFET having different operating voltages (threshold voltages (Vt)). For example, since narrower fins are less sensitive to dopants often introduced into fin channels to vary threshold voltage, a range of obtainable threshold voltages is constrained by the shrinking fin widths implemented in advanced IC technology nodes. In another example, higher doping concentrations needed for obtaining higher voltage threshold FinFETs (in some implementations, doping concentrations as much as about three to about ten times higher than doping concentrations used in conventional planar devices) can significantly degrade transistor mismatch performance ("AVt," which generally characterizes a slope of transistor matching (a standard deviation of a difference in threshold voltages between two nearby, nominally identical transistors) relative to a square root of transistor area), which can increase FinFET variation as well as limit minimum supply voltages (Vcc(min)) desired for memory arrays, such as static random access memory (SRAM) arrays.

FinFET processing has thus turned to fabricating gates with different work functions (for example, a gate of the p-type FinFET is different than a gate of the n-type FinFET) to achieve different voltage thresholds, which is also reaching limits as FinFET technologies continue to scale FinFET dimensions. For example, shrinking fin pitches and shrinking gate lengths limit a number and/or a thickness of layers that can be included in the gates to achieve different work functions and introduce processing barriers, such as the inability to remove a layer from particular gates because of the layer merging within small spaces (referred to as metal merge). Accordingly, various channel materials and/or configurations of channel materials have also been explored to obtain high mobility strained channels for improving FinFET performance, such as the on-to-off current ratio ($I_{on}/I_{off}$). For example, silicon germanium, germanium, and/or other III-V materials can be implemented in the p-type FinFET's channel to enhance strain in the channel and further extend the threshold voltage tuning range, allowing the same work function materials to be implemented in gates of the n-type FinFET and p-type FinFET while still meeting threshold voltage requirements. In such FinFET configurations, the p-type FinFET can include a silicon germanium and/or germanium channel material and the n-type FinFET can include a silicon channel material, where fins of the p-type FinFET and the n-type FinFET (including the channel materials) are fabricated at an outset of FinFET fabrication. However, subsequent processing has been observed to degrade benefits achieved by the silicon germanium and/or germanium channel materials. For example, processes for activating dopants of source/drain regions of the FinFETs (for example, lightly doped source/drain (LDD), heavily doped source/drain (LDD), and/or epitaxial source/drain activation annealing processes) have been observed to change material properties and/or characteristics of the silicon germanium and/or germanium channel materials and/or relax strain provided by the silicon germanium and/or germanium channel materials. In some instances, higher temperatures cause out diffusion of the germanium from the channel regions of the fins. Thermal budget limitations are thus introduced into subsequent processing by the silicon germanium and/or germanium channel materials to limit out diffusion and/or strain relaxation, thereby minimizing FinFET instability and/or defect generation. Accordingly, new approaches are needed for facilitating threshold voltage tuning that are immune to continual scaling of FinFETs in advanced IC technology nodes.

The present disclosure addresses these FinFET challenges. Embodiments disclosed herein propose a complementary FinFET device that includes an n-type FinFET having a silicon fin, a p-type FinFET having a silicon fin, and a gate structure disposed over a channel region of the silicon fin of the n-type FinFET and a channel region of the silicon fin of the p-type FinFET. The p-type FinFET further includes a silicon germanium channel capping layer (or other III-V material channel capping layer that can achieve a high mobility strained channel) that wraps the channel region of the silicon fin, such that the silicon germanium channel capping layer is disposed between the gate structure and the channel region of the silicon fin. By forming the silicon germanium channel capping layer during a gate replacement process, a p-type FinFET with a high mobility strained channel material is fabricated in a manner that minimizes detrimental effects that can experienced by the channel material during subsequent processing. For example, the silicon germanium channel capping layer is not subjected to thermal processes and/or annealing processes used when fabricating LDD regions, HDD regions, epitaxial source/drain features, thicker gate dielectrics for portions of IC device (for example, for FinFETs in an input/output region), and/or other FinFET and/or IC device features, thereby preventing (or minimizing) out-diffusion of germanium (or other III-V species) and/or strain relaxation. The proposed fabrication method further minimizes a number of thermal processes that the silicon germanium channel capping layer is exposed to, which can reduce transistor mismatching (for example, Avt) and/or minimum supply voltages for memories. A complementary FinFET is thus disclosed that has a p-type FinFET having a high mobility strained channel for facilitating threshold voltage tuning of the p-type FinFET and the n-type FinFET without significant reliance on a number of layers and/or a thickness of layers of their respective gates. In some implementations, because the p-type FinFET includes the silicon germanium channel capping layer, the p-type FinFET and the n-type FinFET can have gates that include the same work function layers and/or materials, yet still exhibit threshold voltages that facilitate optimal performance. Different embodiments may have different advantages, and no particular advantage is necessarily required of any embodiment.

FIG. 1 is a flow chart of a method 10 for fabricating an IC device according to various aspects of the present disclosure. At block 15, method 10 includes forming a first silicon fin in a first type FinFET device region and a second silicon fin in a second type FinFET device region. At block 20, method 10 proceeds with forming a gate structure having a dummy gate over a first channel region of the first silicon fin and a second channel region of the second silicon fin. In some implementations, before forming the gate structure, an isolation feature is formed that surrounds a portion of the first silicon fin and the second silicon fin, thereby defining lower active fin regions and upper fin active fin regions of the first silicon fin and the second silicon fin. In such implementations, the gate structure is formed over the upper fin active regions of the first silicon fin and the second silicon fin. At block 25, method 10 proceeds with forming first epitaxial source/drain features over first source/drain regions of the first silicon fin and second epitaxial source/drain features over second source/drain regions of the second silicon fin. In some implementations, the first epitaxial source/drain features include silicon and germanium, and the second epitaxial source/drain features includes silicon. At block 30, method 10 proceeds with forming an interlevel dielectric layer over the first epitaxial source/drain features, the second epitaxial source/drain features, and the gate structure. At block 35, method 10 proceeds with removing the dummy gate, thereby forming an opening that exposes the first channel region of the first silicon fin and the second channel region of the second silicon fin. At block 40, method 10 proceeds with forming a blocking layer that partially fills the opening and covers the second channel region of the second silicon fin. In some implementations, the blocking layer includes a dielectric material. At block 45, method 10 proceeds with forming a silicon germanium channel capping layer over the first channel region of the first silicon fin. In some implementations, a selective deposition process is performed to selectively deposit a silicon-and-germanium comprising material over the first silicon fin. In some implementations, a concentration of germanium in the silicon-and-germanium comprising material of the silicon germanium channel capping layer is less than a concentration of germanium in the first epitaxial source/drain features. At block 50, method 10 proceeds with removing the blocking layer, for example, by a selective etching process. At block 55, method 10 proceeds with forming a metal gate in the opening over the silicon germanium channel capping layer and the second silicon fin. In some implementations, the metal gate includes a high-k gate dielectric and a metal gate electrode. At block 60, method 10 can proceed with completing fabrication. For example, various contacts can be formed to the first metal gate, the second metal gate, the first epitaxial source/drain features, and/or the second epitaxial source/drain features. Additional steps can be provided before, during, and after method 10, and some of the steps described can be moved, replaced, or eliminated for additional embodiments of method 10.

FIGS. 2A-11A are top views of a FinFET device 100, in portion or entirety, at various fabrication stages of a method, such as method 10 of FIG. 1, according to various aspects of the present disclosure. FIGS. 2B-11B are fragmentary cross-sectional views of FinFET device 100 along line B-B of FIGS. 2A-11A according to various aspects of the present disclosure. FIG. 6C, FIG. 7C, and FIG. 11C are fragmentary cross-sectional views of FinFET device 100 along line C-C respectively of FIG. 6A, FIG. 7A, and FIG. 11A according to various aspects of the present disclosure. FIG. 11D is a fragmentary cross-sectional view of FinFET device 100 along line D-D of FIG. 11A according to various aspects of the present disclosure. FinFET device 100 includes various device regions, such as a p-type FinFET region 102A configured to include a p-type FinFET and an n-type FinFET region 102B configured to include an n-type FinFET, such that FinFET device 100 includes complementary FinFETs. P-type FinFET region 102A and/or n-type device FinFET region 102B can be a portion of a core region (often referred to as a logic region), a memory region (such as a static random access memory (SRAM) region), an analog region, a peripheral region (often referred to as an input/output (I/O) region), a dummy region, other suitable region, or combinations thereof. In the depicted embodiment, p-type FinFET region 102A and n-type FinFET region 102B are a portion of a core region of FinFET device 100, which can further include various passive and active microelectronic devices, such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some implementations, FinFET device 100 may be a portion of an IC chip, a system on chip (SoC), or portion thereof. FIGS. 2A-11A, FIGS. 2B-11B, FIG. 6C, FIG. 7C, FIG. 11C, and FIG. 11D have been simplified for the sake of clarity to better understand the inventive concepts of the present disclosure. Additional features can be added in FinFET device 100, and some of the features described below can be replaced, modified, or eliminated in other embodiments of FinFET device 100.

Figure 2A:
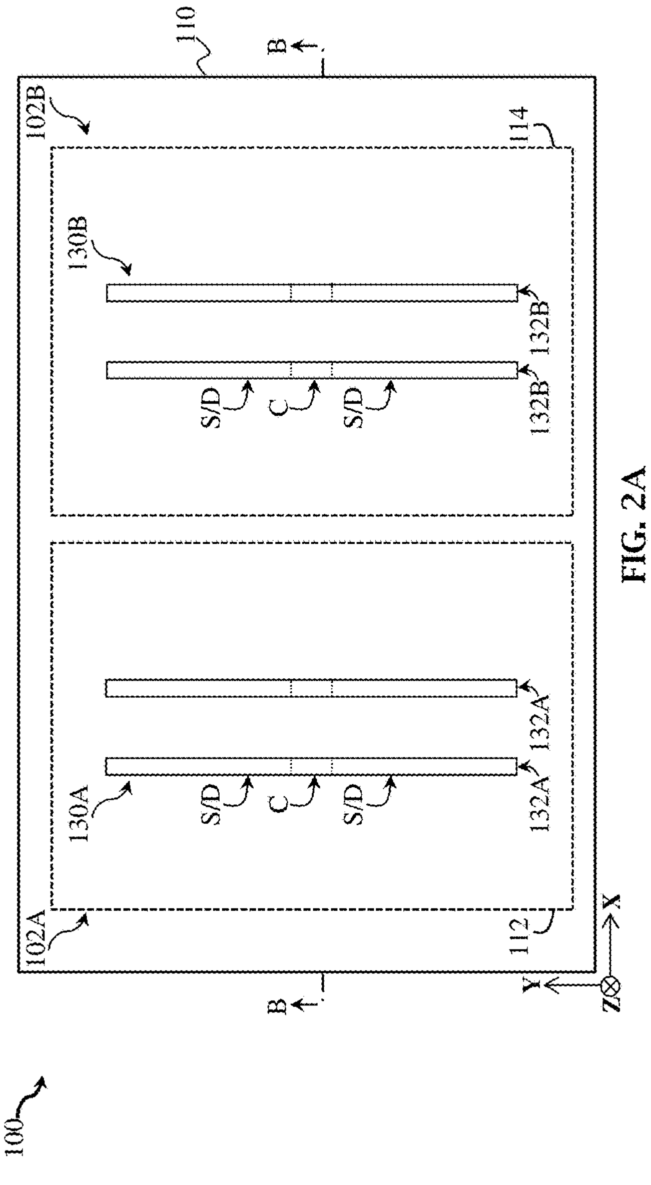
Figure 2B:
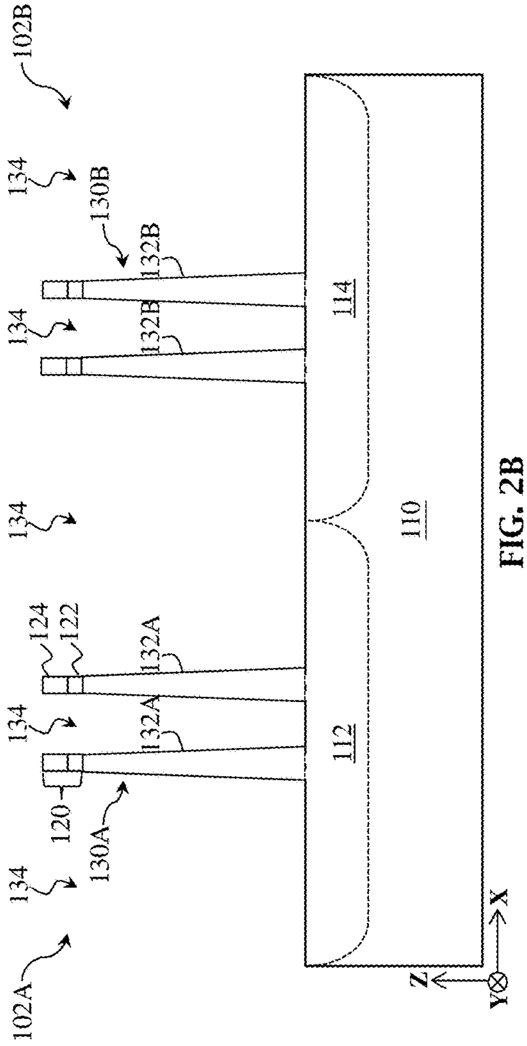

Turning to FIG. 2A and FIG. 2B, a substrate (wafer) 110 (which can include a doped region 112 and a doped region 114) is patterned using a patterning layer 120 (which can include a pad layer 122 and a mask layer 124) to form a fin structure 130A (having fins 132A) in p-type FinFET region 102A and a fin structure 130B (having fins 132B) in n-type FinFET region 102B. In the depicted embodiment, substrate 110 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlinAs, AlGaAs, GalnAs, GaInP, and/or GaInAsP; other group III-V materials; other group II-IV materials; or combinations thereof. Alternatively, substrate 110 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 110 includes various doped regions, such as doped region 112 and doped region 114, configured according to design requirements of FinFET device 100. In some implementations, substrate 110 includes p-type doped regions (for example, p-type wells) doped with p-type dopants, such as boron (for example, $BF_2$), indium, other p-type dopant, or combinations thereof. In some implementations, substrate 110 includes n-type doped regions (for example, n-type wells) doped with n-type dopants, such as phosphorus, arsenic, other n-type dopant, or combinations thereof. In some implementations, substrate 110 includes doped regions formed with a combination of p-type dopants and n-type dopants. In the depicted embodiment, doped region 112 is configured for a p-type FinFET and doped region 114 is configured for an n-type FinFET. For example, doped region 112 is an n-type well and doped region 114 is a p-type well. The various doped regions can be formed directly on and/or in substrate 110, for example, providing a p-well structure, an n-well structure, a dual-well structure, a raised structure, or combinations thereof. An ion implantation process, a diffusion process, and/or other suitable doping process can be performed to form the various doped regions.

Patterning layer 120 includes a material that is different than a material of substrate 110 to achieve etching selectivity during a fin etching process, such that substrate 110 can be selectively etched with minimal (or no) etching of patterning layer 120. In the depicted embodiment, patterning layer 120 includes a pad layer 122 and a mask layer 124, where pad layer 122 is disposed on substrate 110 and mask layer 124 is disposed on pad layer 122. In some implementations, pad layer 122 includes silicon and oxygen (for example, silicon oxide (in some implementations, $SiO_2$)), and mask layer 124 includes silicon and nitrogen (for example, silicon nitride (in some implementations, $Si_3N_4$) or silicon oxynitride). In some implementations, pad layer 122 is a silicon oxide layer formed by thermal oxidation and/or other suitable process, and mask layer 124 is a silicon nitride layer formed by chemical vapor deposition (CVD), low pressure CVD (LPCVD), plasma enhanced CVD (PECVD), thermal nitridation (for example, of silicon), other suitable process, or combinations thereof. In some implementations, pad layer 122 includes a material that promotes adhesion between substrate 110 and mask layer 124 and/or functions as an etch stop layer when etching mask layer 124. Other materials for and/or methods for forming pad layer 122 and/or mask layer 124, along with other configurations of patterning layer 120, are contemplated by the present disclosure.

Fin structure 130A and fin structure 130B can include more or less fins than depicted in FIG. 2A and FIG. 2B. Fins 132A are oriented substantially parallel to one another, and fins 132B are oriented substantially parallel to one another. Fins 132A, 132B each have a width defined in an x-direction, a length defined in a y-direction, and a height defined in a z-direction. Furthermore, fins 132A, 132B each have at least one channel region (C) and at least one source/drain region (S/D) defined along their length in the y-direction, where the at least one channel region is disposed between source/drain regions. The channel region(s) includes a top portion of fins 132A, 132B defined between sidewall portions of fins 132A, 132B, where the top portion and the sidewall portions engage with a gate structure (as described below), such that current can flow between the source/drain regions during operation of FinFET device 100. The source/drain regions can also include top portions of fins 132A, 132B defined between sidewall portions of fins 132A, 132B. In some implementations, fins 132A, 132B are a portion of substrate 110 (such as a portion of a material layer of substrate 110). For example, in the depicted embodiment, where substrate 110 includes silicon, fins 132A, 132B include silicon. Alternatively, in some implementations, fins 132A, 132B are defined in a material layer, such as one or more semiconductor material layers, overlying substrate 110. For example, fins 132A, 132B can include a semiconductor layer stack having various semiconductor layers (such as a heterostructure) disposed over substrate 110. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of FinFET device 100. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b$ from bottom to top, where a and c are different atomic percentages of silicon and b and d are different atomic percentages of germanium). In some implementations, fins 132A, 132B include the same or different materials and/or the same or different semiconductor layer stacks depending on design requirements of their respective FinFETs and/or region of FinFET device 100. In furtherance of the depicted embodiment, trenches 134 are defined between adjacent fins 132A, adjacent fins 132B, and adjacent fin structures (here, between one of fins 132A of fin structure 130A and one of fin 132B of fin structure 130B). Trenches 134 have sidewalls defined by sidewalls of fins 132A, fins 132B, and/or patterning layer 120 and bottoms defined by top surfaces of substrate 110.

Fins 132A, 132B are formed over substrate 110 using any suitable process. In some implementations, a combination of deposition, lithography and/or etching processes are performed to define fins 132A, 132B extending from substrate 110 as illustrated in FIG. 2A and FIG. 2B. For example, forming fins 132A, 132B includes forming pad layer 122 and mask layer 124 over substrate 110, forming a patterned resist layer over mask layer 124 using a lithography process, etching the pad layer 122 and mask layer 124 using the patterned resist layer as an etch mask, and removing the patterned resist layer (for example, by a resist stripping process), leaving patterning layer 120 that includes openings that expose substrate 110. The lithography processes can include forming a resist layer (for example, by spin-on coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The patterned resist layer can then be used as an etch mask during an etching process to remove portions of an underlying layer, such as a sacrificial layer or a mandrel material layer. The etching process can include a dry etching process (for example, a reactive ion etching (RIE) process), a wet etching process, other suitable etching process, or combinations thereof. The patterned resist layer can be removed before or after the etching process. In some implementations, the exposure process can implement maskless lithography, electron-beam writing, ion-beam writing and/or nanoprint technology.

Alternatively or additionally, fins 132A, 132B are formed by a multiple patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, double patterning processes and/or multiple patterning processes combine lithography processes and self-aligned processes, allowing patterns to be created that have, for example, pitches smaller than what is otherwise obtainable using a single, direct lithography process. For example, in some implementations, a mandrel layer is used as an etch mask for removing portions of mask layer 124 and pad layer 122 to form patterning layer 210, where the mandrel layer is formed using a spacer patterning technique. For example, forming the mandrel layer includes forming a patterned sacrificial layer (which includes sacrificial features having a first spacing) over mask layer 124 using a lithography process, forming a spacer layer over the patterned sacrificial layer, etching the spacer layer to form spacers along sidewalls of each sacrificial feature (for example, the spacer layer is removed from a top surface of the sacrificial features and a portion of a top surface of mask layer 124), and removing the patterned sacrificial layer, leaving spacers having a second spacing (which can be referred to as a patterned spacer layer, which includes openings that expose a portion of mask layer 124). Mandrel layer and its mandrels can thus respectively be referred to as a spacer layer and spacers. In some implementations, the spacer layer is conformally formed over the patterned sacrificial layer, such that the spacer layer has a substantially uniform thickness. In some implementations, the spacers are trimmed before or after removing the patterned sacrificial layer. In some implementations, directed self-assembly (DSA) techniques are implemented while forming fins 132A, 132B.

Figures 3A, 3B:
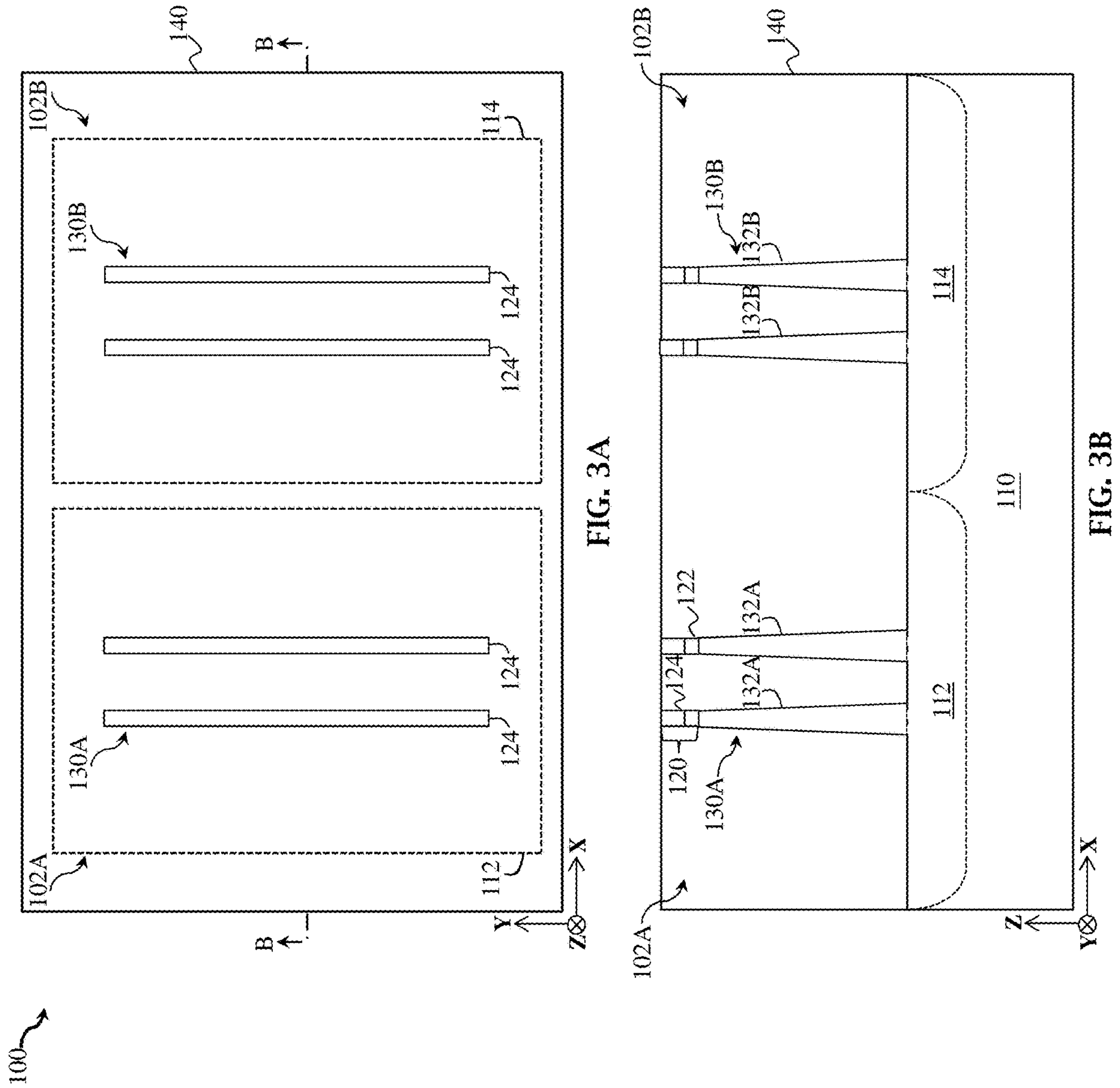

Turning to FIG. 3A and FIG. 3B, an isolation layer 140 is formed over FinFET device 100. Isolation layer 140 fills trenches 134 and covers substrate 110, patterning layer 120, fins 132A, and fins 132B. Isolation layer 140 is subsequently patterned (which is described in detail below) to form an isolation feature, such as a shallow trench isolation feature, for providing electrical isolation. Isolation layer 140 thus includes an isolation material, such as silicon oxide, silicon nitride, silicon oxynitride, other suitable isolation material (for example, including silicon, oxygen, nitrogen, carbon, and/or other suitable isolation constituent), or combinations thereof. In the depicted embodiment, isolation layer 140 includes an oxide material, such as silicon oxide, and can thus be referred to as an oxide layer. In some implementations, isolation layer 140 includes a multi-layer structure, such as a bulk dielectric layer disposed over a liner dielectric layer, where the bulk dielectric layer and the liner dielectric layer include materials depending on design requirements. In some implementations, isolation layer 140 includes a dielectric layer disposed over a doped liner layer (including, for example, boron silicate glass (BSG) and/or phosphosilicate glass (PSG)). Isolation layer 140 is deposited by CVD, physical vapor deposition (PVD), atomic layer deposition (ALD), high density plasma CVD (HDPCVD), metal organic CVD (MOCVD), remote plasma CVD (RPCVD), PECVD, LPCVD, atomic layer CVD (ALCVD), atmospheric pressure CVD (APCVD), other suitable deposition process, or combinations thereof. In some implementations, isolation layer 140 is deposited by a flowable CVD (FCVD) process, which includes depositing a flowable dielectric material (in some implementations, in a liquid state) over substrate 110 and converting the flowable dielectric material into a solid material (for example, using an annealing process). The flowable dielectric material flows into trenches 134 and conforms to exposed surfaces of FinFET device 100, enabling void free filling of trenches 134. A planarization process, such as a chemical mechanical polishing (CMP) process, can be performed on isolation layer 140. In the depicted embodiment, patterning layer 120 (in particular, mask layer 124) functions as a CMP stop layer, such that the planarization process is performed until reaching and exposing mask layer 124. The planarization process removes isolation layer 140 disposed over a top surface of patterning layer 120. In some implementations, top surfaces of isolation layer 140 and patterning layer 120 are substantially co-planar after the planarization process.

Figure 4A:
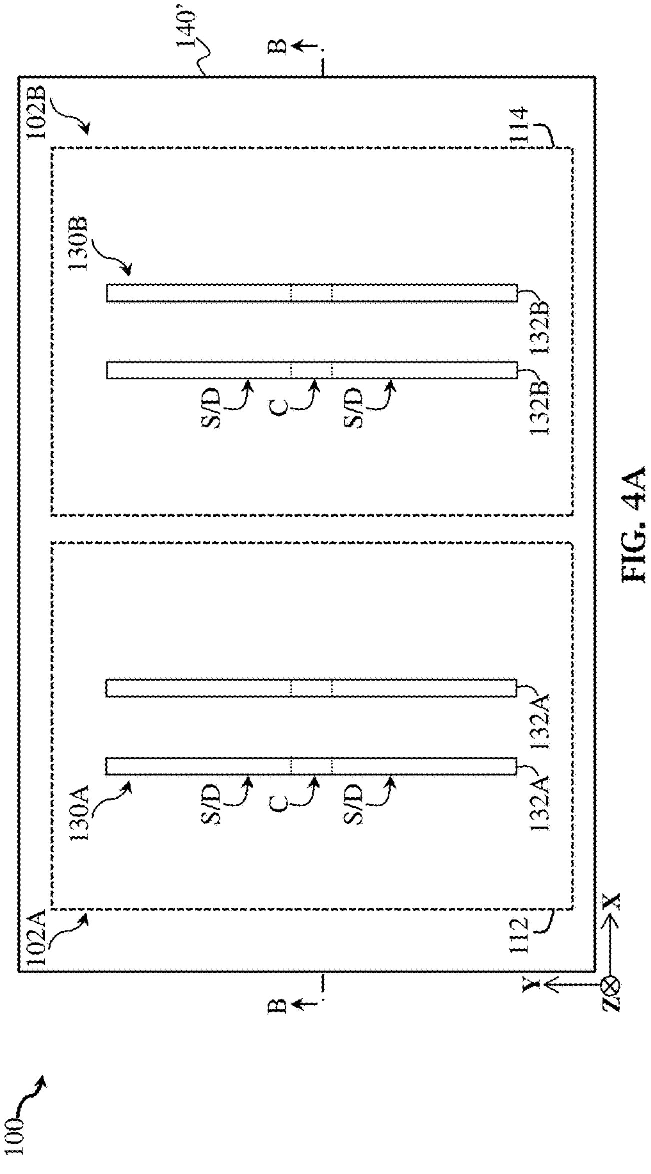
Figure 4B:
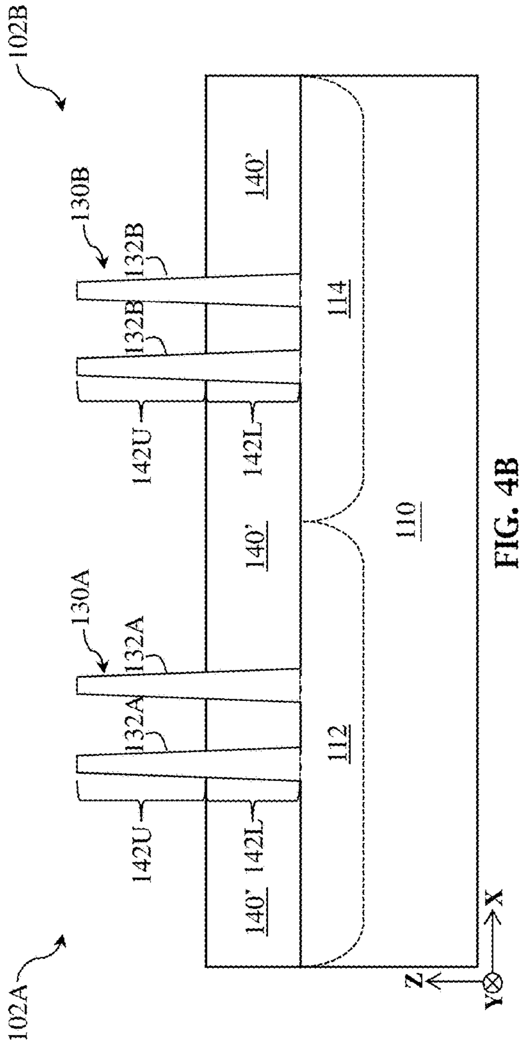

Turning to FIG. 4A and FIG. 4B, isolation layer 140 is recessed, such that fins 132A and fins 132B extend (protrude) from between neighboring isolation features 140'. Isolation features 140' electrically isolate active device regions and/or passive device regions of FinFET device 100 from each other, such as p-type FinFET region 102A and n-type FinFET region 102B. For example, isolation features 140' separate and electrically isolate fin structure 130A from fin structure 130B. Isolation features 140' also separate and electrically isolate fins 132A and fins 132B from one another. Isolation features 140' can be configured as different structures, such as shallow trench isolation (STI) structures, deep trench isolation (DTI) structures, local oxidation of silicon (LOCOS) structures, or combinations thereof. In the depicted embodiment, isolation features 140' surround a bottom portion of fins 132A and fins 132B, thereby defining upper fin active regions 142U (also referred to as channel regions and generally referring to a portion of fins 132A, 132B that extends from a top surface of isolation features 140') and lower fin active regions 142L (also referred to as non-channel regions and generally referring to a portion of fins 132A, 132B surrounded by isolation features 140', which extend from a top surface of substrate 110 to the top surface of isolation features 140'). Upper fin active regions 142U have a height defined between a top surface of isolation features 140' and a top surface of fins 132A, 132B, and lower fin active regions 142L have a height defined between a top surface of substrate 210 and the top surface of isolation features 140'. In some implementations, the height of upper fin active regions 142U is about 35 nm to about 90 nm, and the height of the lower fin active regions 142L is about 30 nm to about 200 nm. In some implementations, a width of upper fin active regions 142U is about 1 nm to about 8 nm, and a width of lower fin active regions 142L is about 5 nm to about 20 nm. In some implementations, an etch back process recesses isolation layer 140 until achieving a desired (target) height of upper fin active regions 142. The etch back process further removes patterning layer 120 (here, mask layer 124 and pad layer 122) from over fins 132A, 132B. The etch back process is a dry etching process, a wet etching process, or a combination thereof. The etch back process selectively etches isolation layer 140 and patterning layer 120 without (or minimally) etching fins 132A, 132B. For example, an etching chemistry can be tuned throughout the etch back process to selectively etch silicon oxide and/or silicon nitride without (or minimally) etching silicon.

Figure 5A:
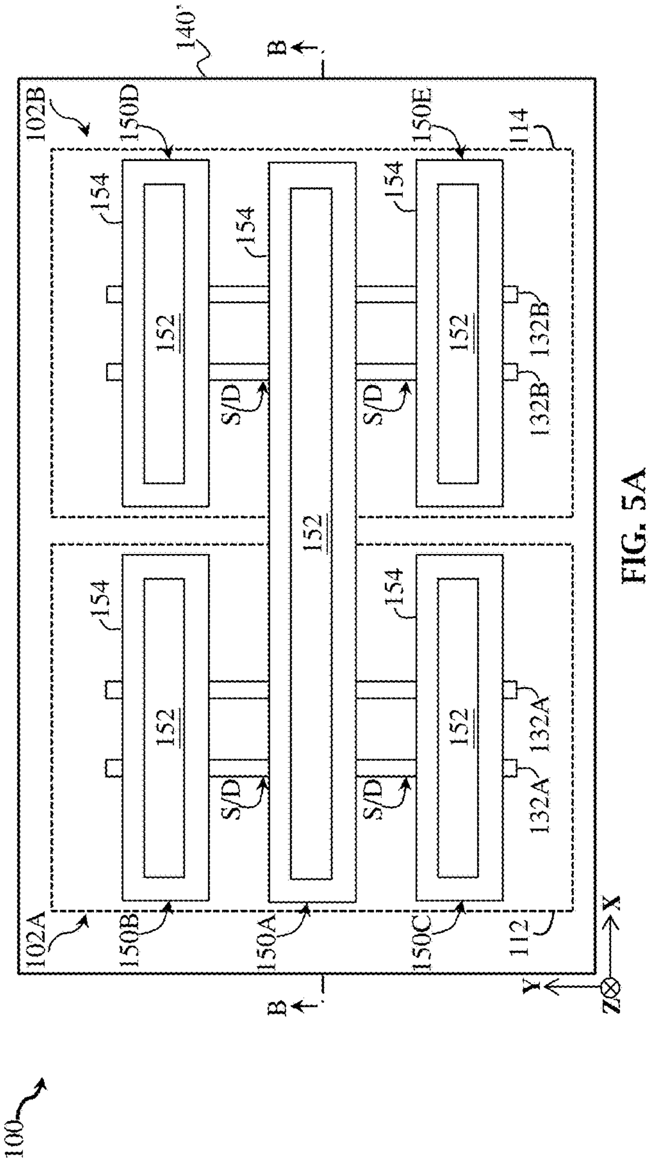
Figure 5B:
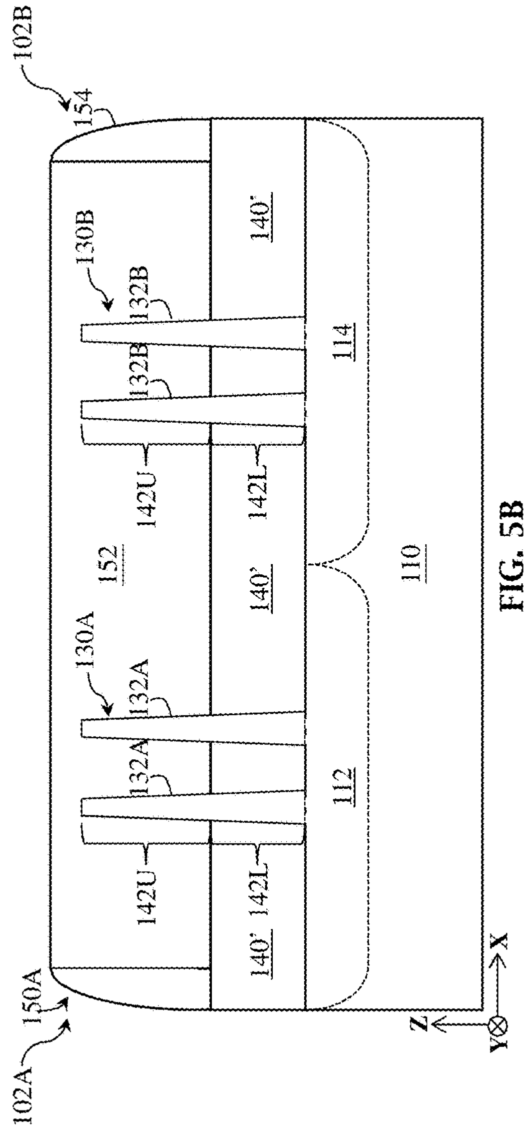

Turning to FIG. 5A and FIG. 5B, various gate structures are formed over fins 132A, 132B, such as a gate structure 150A, a gate structure 150B, a gate structure 150C, a gate structure 150D, and a gate structure 150E. Gate structures 150A-150E extend along the x-direction (for example, substantially perpendicular to fins 132A, 132B) and traverse respective fin structures 130A, 130B, such that gate structures 150A-150E wrap upper fin active regions 142U of respective fins 132A, 132B. In the depicted embodiment, gate structure 150A is disposed over channel regions of fins 132A, 132B. Gate structure 150A wraps the channel regions of fins 132A, 132B, thereby interposing respective source/drain regions of fins 132A, 132B. Gate structure 150A engages the respective channel regions of fins 132A, 132B, such that current can flow between the respective source/drain regions of fins 132A, 132B during operation. Gate structure 150B wraps portions of fins 132A, positioned such that a source/drain region of fins 132A is disposed between gate structure 150B and gate structure 150A; gate structure 150C wraps portions of fins 132A, positioned such that a source/drain region of fins 132A is disposed between gate structure 150C and gate structure 150A; gate structure 150D wraps portions of fins 132B, positioned such that a source/drain region of fins 132B is disposed between gate structure 150D and gate structure 150A; and gate structure 150E wraps portions of fins 132B, positioned such that a source/drain region of fins 132B is disposed between gate structure 150E and gate structure 150A. In some implementations, gate structures 150A is an active gate structure, whereas gate structures 150B-150E are dummy gate structures. "Active gate structure" generally refers to an electrically functional gate structure of FinFET device 100, whereas "dummy gate structure" generally refers to an electrically non-functional gate structure of FinFET device 100. In some implementations, a dummy gate structure mimics physical properties of an active gate structure, such as physical dimensions of the active gate structure, yet is inoperable (in other words, does not enable current to flow). In some implementations, gate structures 150B-150E enable a substantially uniform processing environment, for example, enabling uniform epitaxial material growth in source/drain regions of fins 132A, 132B (for example, when forming epitaxial source/drain features), uniform etch rates in source/drain regions of fins 132A, 132B (for example, when forming source/drain recesses), and/or uniform, substantially planar surfaces (for example, by reducing (or preventing) CMP-induced dishing effects). In some implementations, gate structures 150B, 150C further isolate the p-type FinFET (which includes gate structure 150A) in p-type FinFET region 102A from other devices and/or features of FinFET device 100, and gate structures 150D, 150E further isolate the n-type FinFET (which includes gate structure 150A) in n-type FinFET region 102B from other devices and/or features of FinFET device 100.

Gate structures 150A-150E include gate stacks configured to achieve desired functionality according to design requirements of FinFET device 100, such that gate structures 150A-150E include the same or different layers and/or materials. Gate structures 150A-150E are fabricated according to a gate last process, such that gate structures 150A-150E have dummy gates 152 in FIG. 5A and FIG. 5B, which are subsequently replaced with metal gates. Dummy gates 152 include, for example, an interfacial layer (including, for example, silicon oxide) and a dummy gate electrode (including, for example, polysilicon). In some implementations, dummy gates 152 include a dummy gate dielectric disposed between the dummy gate electrode and the interfacial layer. The dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$), other suitable high-k dielectric materials, or combinations thereof. High-k dielectric material generally refers to dielectric materials having a high dielectric constant, for example, greater than that of silicon oxide ($k\approx3.9$). Dummy gates 152 can include numerous other layers, for example, capping layers, interface layers, diffusion layers, barrier layers, hard mask layers, or combinations thereof. Dummy gates 152 are formed by deposition processes, lithography processes, etching processes, other suitable processes, or combinations thereof. For example, a deposition process is performed to form a dummy gate electrode layer over substrate 110, fins 132A, fins 132B, and isolation features 140'. In some implementations, a deposition process is performed to form a dummy gate dielectric layer before forming the dummy gate electrode layer, where the dummy gate electrode layer is formed over the dummy gate dielectric layer. The deposition process includes CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern the dummy gate electrode layer (and, in some implementations, the dummy gate dielectric layer) to form dummy gates 152, such that dummy gates 152 wrap fins 132A, 132B as depicted. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Gate structures 150A-150E further include respective gate spacers 154 disposed adjacent to (for example, along sidewalls of) dummy gates 152. Gate spacers 154 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 110 and dummy gates 152 and subsequently anisotropically etched to form gate spacers 154. In some implementations, gate spacers 154 include a multi-layer structure, such as a first dielectric layer that includes silicon nitride and a second dielectric layer that includes silicon oxide. In some implementations, gate spacers 154 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 110 and dummy gates 152 and subsequently anisotropically etched to form a first spacer set adjacent to the gate stacks, and a second dielectric layer including silicon and nitrogen can be deposited over substrate 110 and dummy gates 152 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features (both of which are not shown in FIG. 5A and FIG. 5B) in source/drain (S/D) regions of fins 132A and fins 132B before and/or after forming gate spacers 154.

Figure 6A:
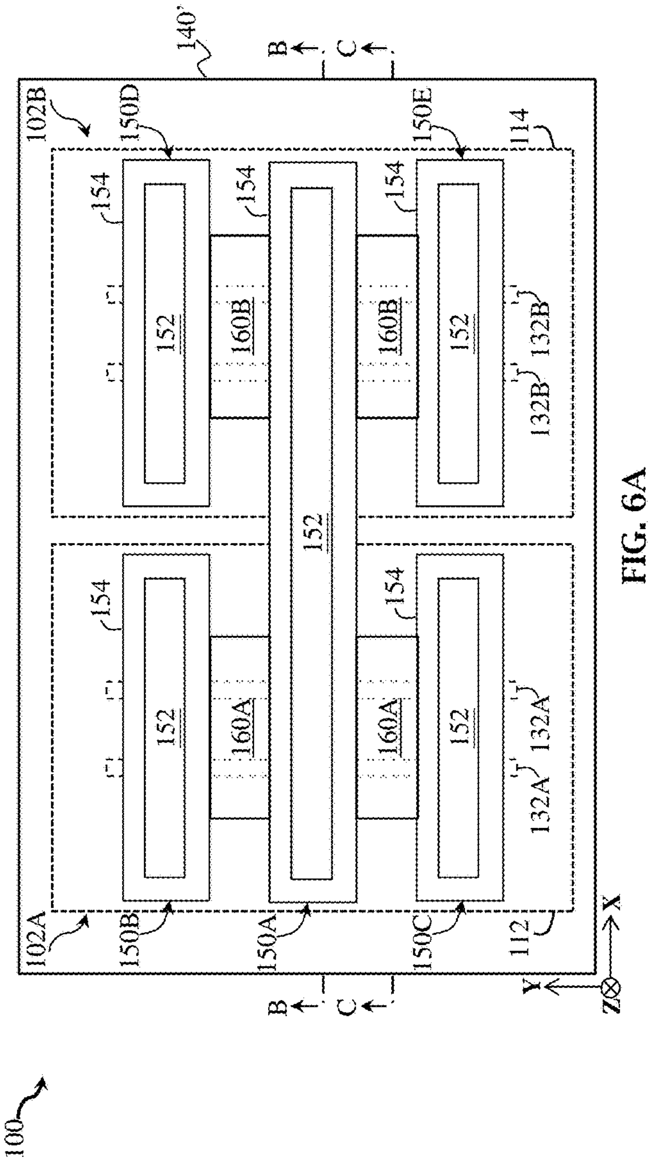
Figure 6B:
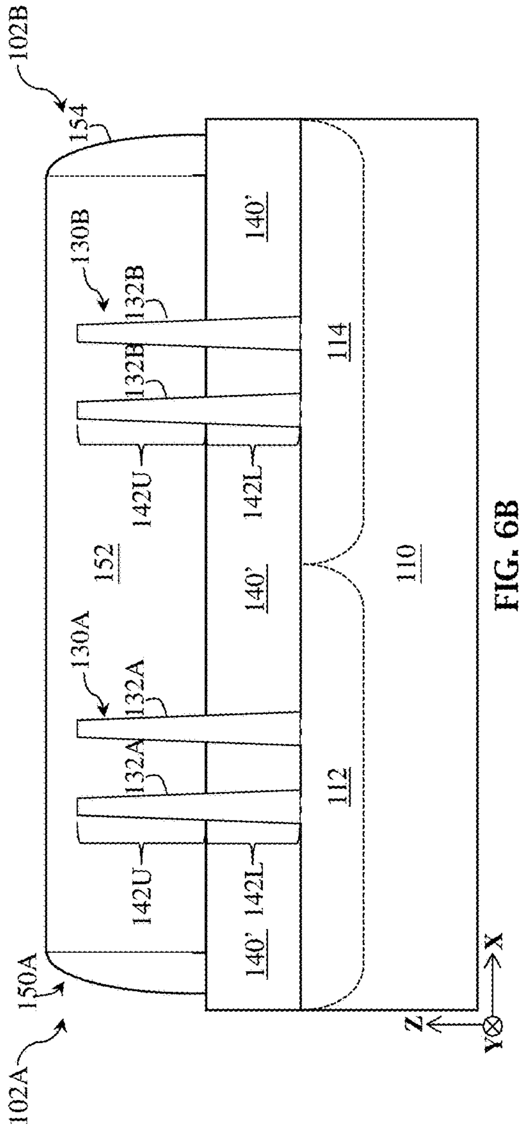
Figure 6C:
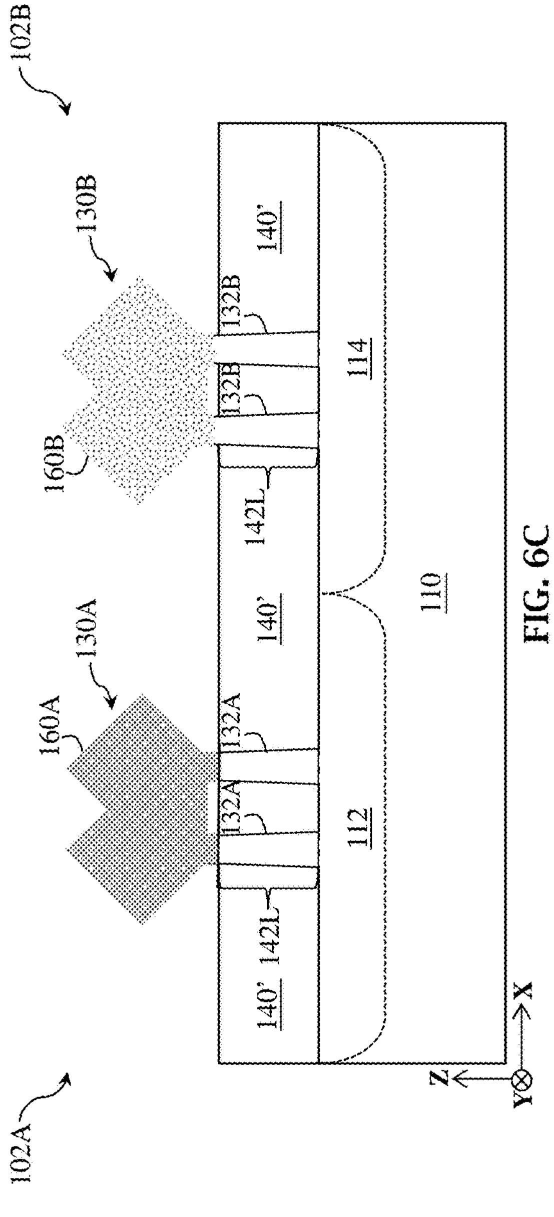
FIG. 6C, FIG. 7C, and FIG. 11C are fragmentary cross-sectional views of the FinFET device along line C-C respectively of FIG. 6A, FIG. 7A, and FIG. 11A according to various aspects of the present disclosure.

Turning to FIGS. 6A-6C, source features and drain features (referred to as source/drain features) are formed in source/drain regions of fins 132A, 132B. For example, semiconductor material is epitaxially grown on fins 132A, 132B, forming epitaxial source/drain features 160A on fins 132A and epitaxial source/drain features 160B on fins 132B. In the depicted embodiment, a fin recess process (for example, an etch back process) is performed on source/drain regions of fins 132A, 132B, such that epitaxial source/drain features 160A and epitaxial source/drain features 160B are grown from lower fin active regions 142L of fins 132A, 132B. In some implementations, source/drain regions of fins 132A, 132B are not subjected to a fin recess process, such that epitaxial source/drain features 160A, 160B are grown from and wrap at least a portion of upper fin active regions 142U. In furtherance of the depicted embodiment, epitaxial source/drain features 160A, 160B extend (grow) laterally along the x-direction (in some implementations, substantially perpendicular to fins 132A, 132B), such that epitaxial source/drain features 160A, 160B are merged epitaxial source/drain features that span more than one fin (for example, epitaxial source/drain features 160A span fins 132A and epitaxial source/drain features 160B span fins 132B). In some implementations, epitaxial source/drain features 160A, 160B include partially merged portions (with interruption (or gaps) between epitaxial material grown from adjacent fins 132A, 132B) and/or fully merged portions (without interruption (or gaps) between epitaxial material grown from adjacent fins 132A, 132B).

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 132A, 132B. Epitaxial source/drain features 160A, 160B are doped with n-type dopants and/or p-type dopants. In the depicted embodiment, epitaxial source/drain features 160A, 160B are configured depending on a type of FinFET fabricated in their respective FinFET device region. For example, in p-type FinFET region 102A, epitaxial source/drain features 160A can include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer). In furtherance of the example, in n-type FinFET region 102B, epitaxial source/drain features 160B can include epitaxial layers including silicon and/or carbon, where silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, or an Si:C:P epitaxial layer). In some implementations, epitaxial source/drain features 160A, 160B include materials and/or dopants that achieve desired tensile stress and/or compressive stress in the channel regions. In some implementations, epitaxial source/drain features 160A, 160B are doped during deposition by adding impurities to a source material of the epitaxy process. In some implementations, epitaxial source/drain features 160A, 160B are doped by an ion implantation process subsequent to a deposition process. In some implementations, annealing processes are performed to activate dopants in epitaxial source/drain features 160A, epitaxial source/drain features 160B, and/or other source/drain features of FinFET device 100, such as HDD regions and/or LDD regions.

Figure 7C:
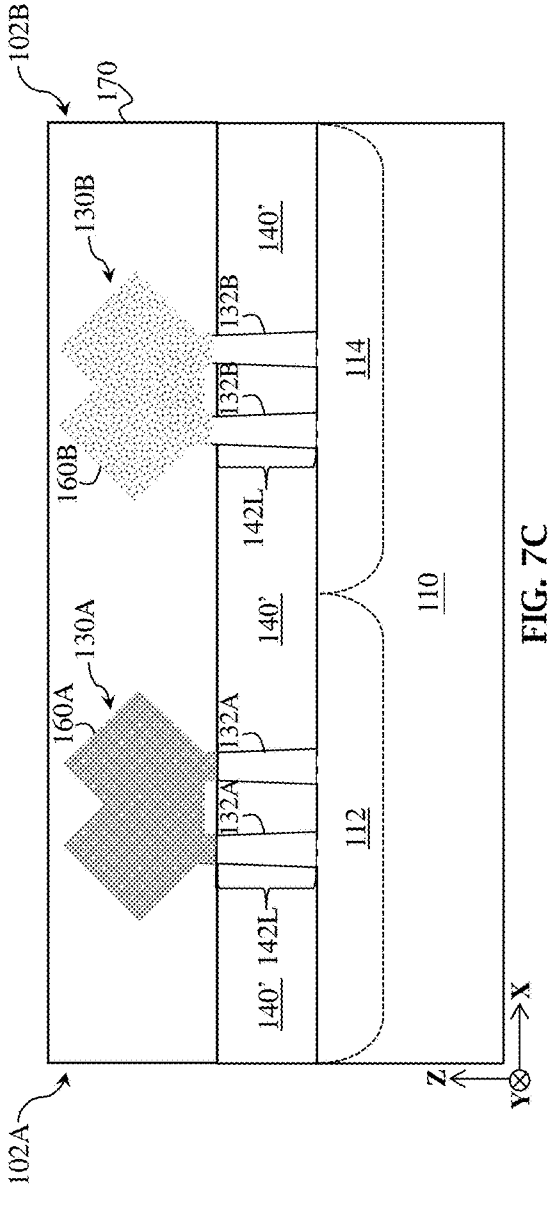
Figure 7A:
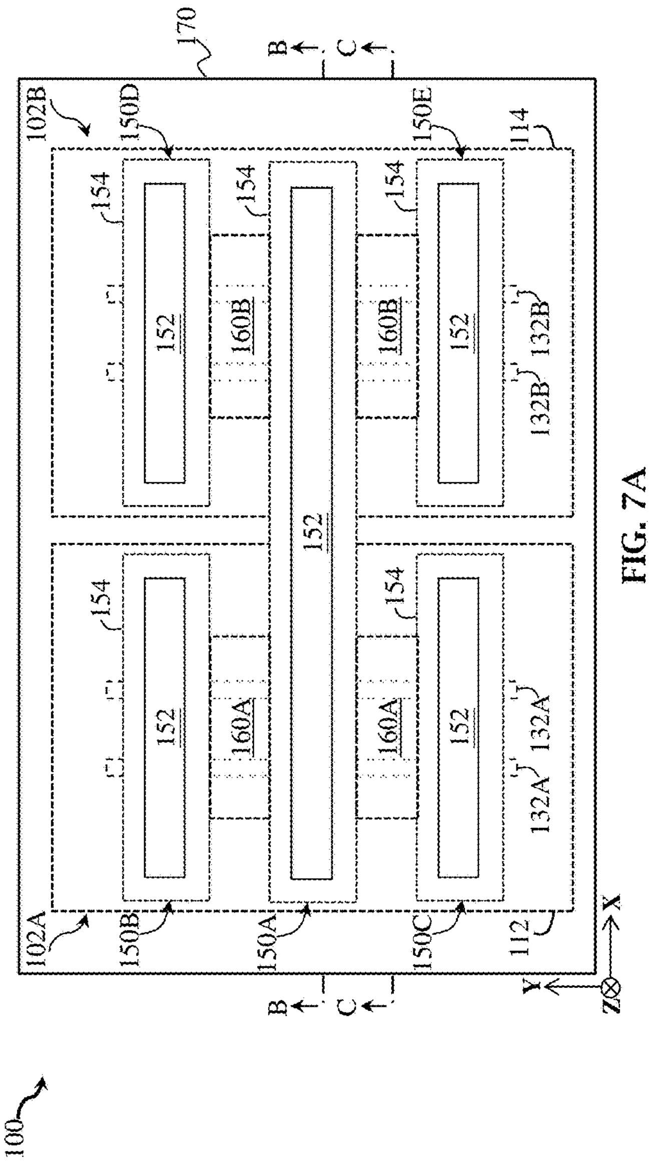
Figure 7B:
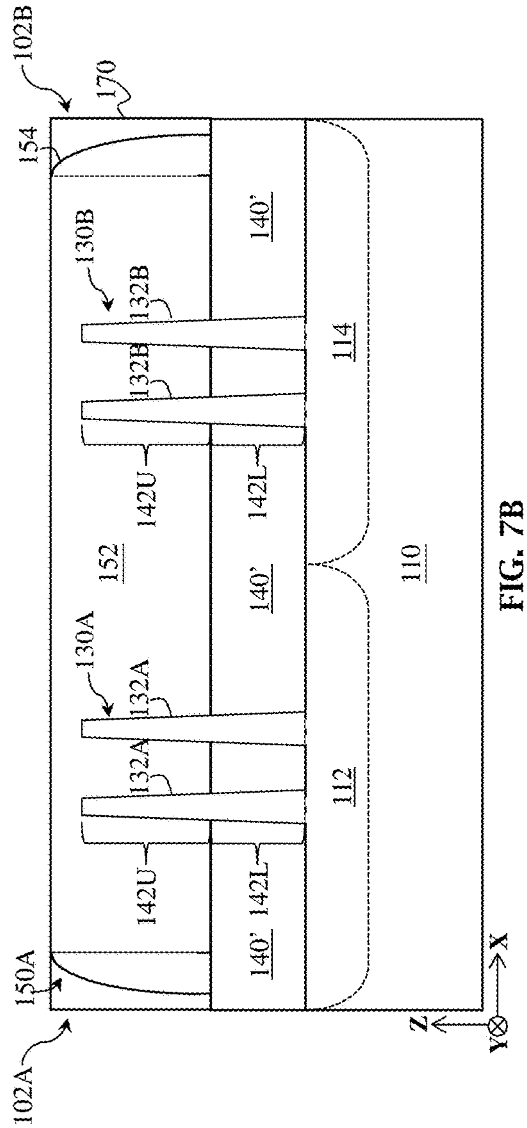

Turning to FIGS. 7A-7C, an interlevel dielectric (ILD) layer 170 is formed over substrate 110, particularly over epitaxial source/drain features 160A, 160B, gate structures 150A-150E, and fins 132A, 132B. In some implementations, ILD layer 170 is a portion of a multilayer interconnect (MLI) feature that electrically couples various devices (for example, transistors, resistors, capacitors, and/or inductors) and/or components (for example, gate structures and/or source/drain features) of FinFET device 100, such that the various devices and/or components can operate as specified by design requirements of FinFET device 100. ILD layer 170 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 170 has a multilayer structure having multiple dielectric materials. In some implementations, a contact etch stop layer (CESL) is disposed between ILD layer 170 and epitaxial source/drain features 160A, 160B, fins 132A, 132B, and/or gate structures 150A-150E. The CESL includes a material different than ILD layer 170, such as a dielectric material that is different than the dielectric material of ILD layer 170. In the depicted embodiment, where ILD layer 170 includes a low-k dielectric material, the CESL includes silicon and nitrogen (for example, silicon nitride or silicon oxynitride). ILD layer 170 and/or the CESL are formed over substrate 110, for example, by a deposition process (such as CVD, FCVD, PVD, ALD, HDPCVD, MOCVD, RPCVD, PECVD, LPCVD, ALCVD, APCVD, plating, other suitable methods, or combinations thereof). Subsequent to the deposition of ILD layer 170 and/or the CESL, a CMP process and/or other planarization process is performed until reaching (exposing) top surfaces of dummy gates 152.

Figure 8A:
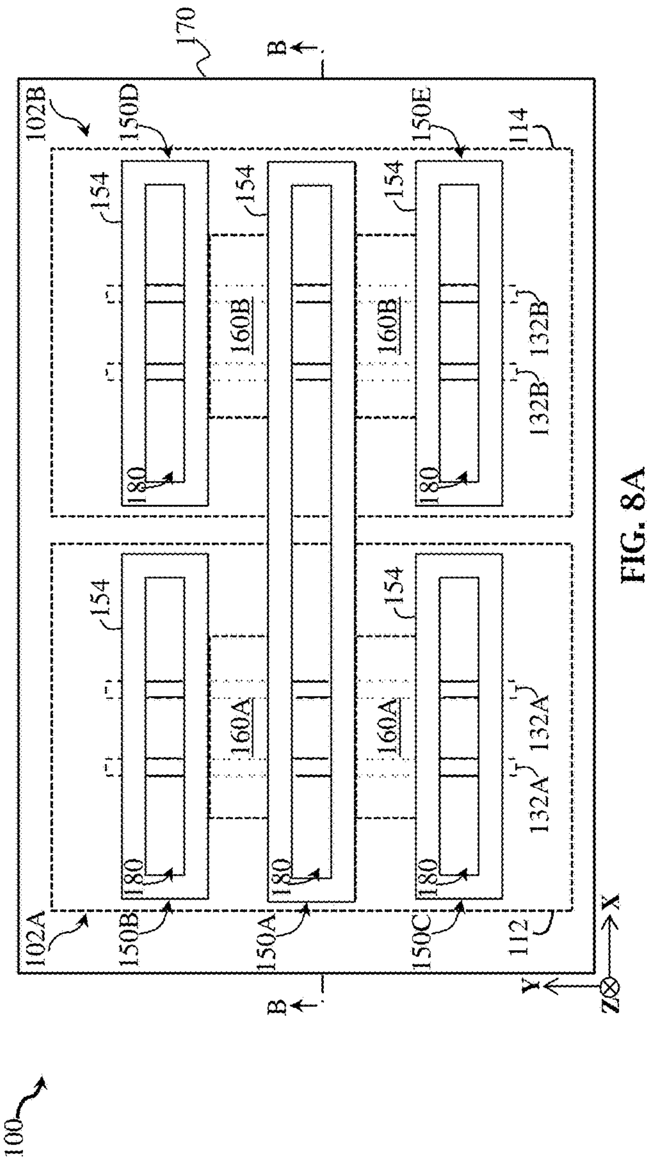
Figure 8B:
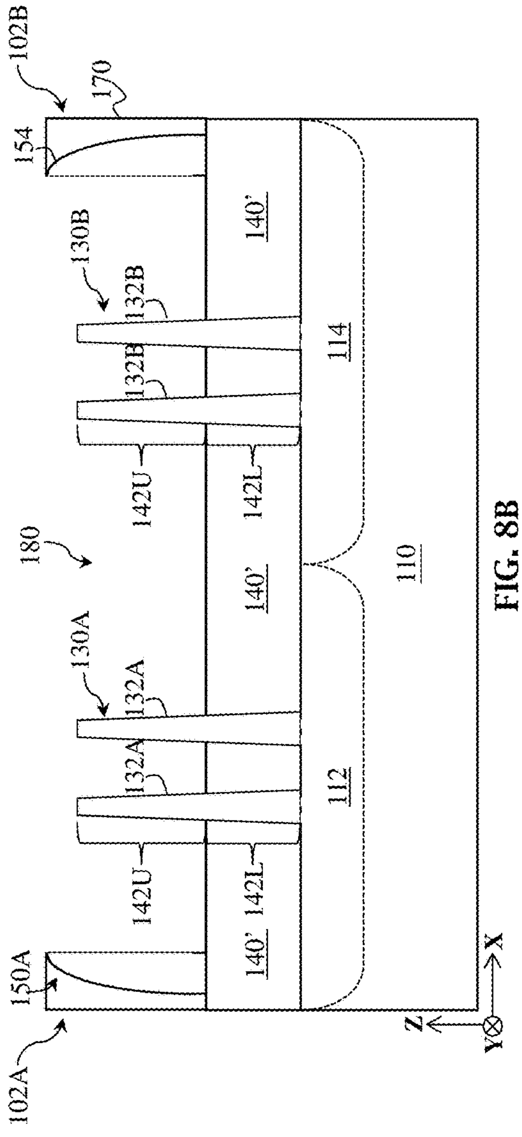

Turning to FIG. 8A and FIG. 8B, dummy gates 152 of gate structures 150A-150E are removed to form gate trenches (gate openings) 180 in gate structures 150A-150E. Gate trenches 180 expose upper fin active regions 142U of fins 132A, 132B. For example, removing dummy gate 152 of gate structure 150A exposes channel regions of fins 132A, 132B. In some implementations, a portion of dummy gates 152 is removed, such that gate trenches 180A expose an interfacial layer and/or a gate dielectric (and, in some implementations, a dummy gate dielectric) of dummy gates 152. The etching process is a dry etching process, a wet etching process, or combinations thereof. In some implementations, an etching process selectively removes dummy gates 152 without (or minimally) removing ILD layer 170, gate spacers 154, isolation features 140', fins 132A, fins 132B, and/or other features of FinFET device 100. In some implementations, a selective etching process can be tuned, such that a dummy gate electrode layer (including, for example, polysilicon) has an adequate etch rate relative to an interfacial layer and/or a dummy gate dielectric of dummy gates 152, gate spacers 154, ILD layer 170, and/or other feature of FinFET device 100. In some implementations, dummy gates 152 of at least one of gate structures 150A-150E is replaced with a metal gate, while dummy gates 152 of at least one of gate structures 150A-150E remains (in other words, is not replaced), such that a trench may not be formed in all of gate structures 150A-150E.

Figure 9A:
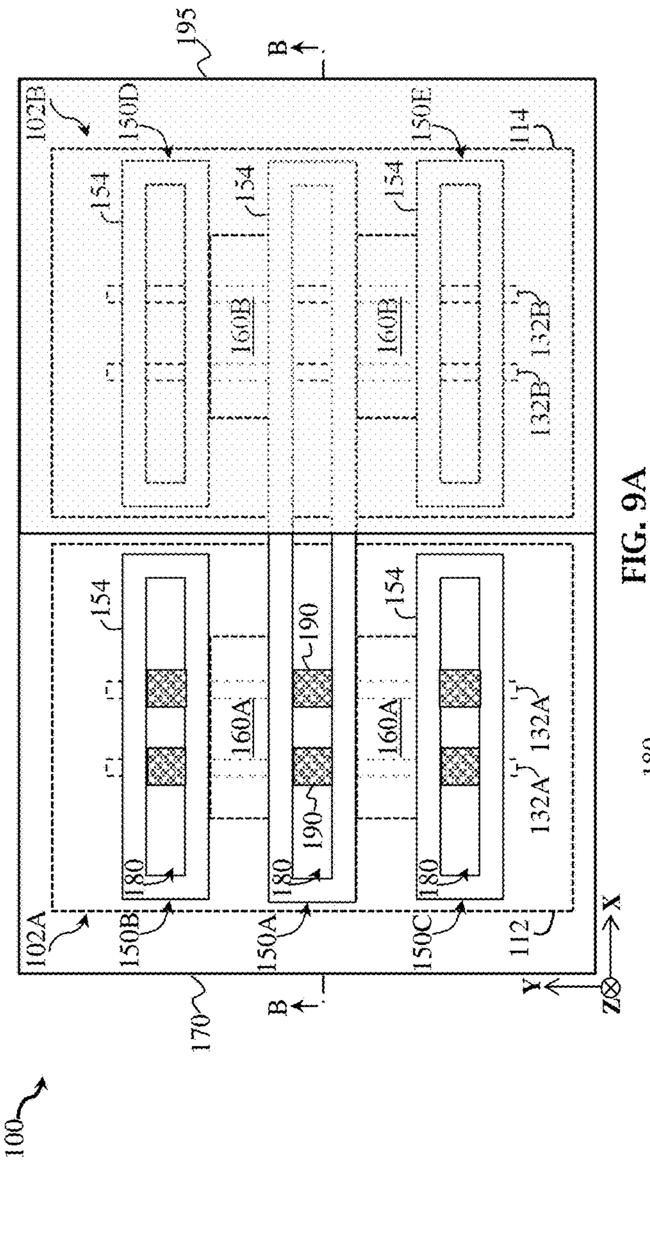
Figure 9B:
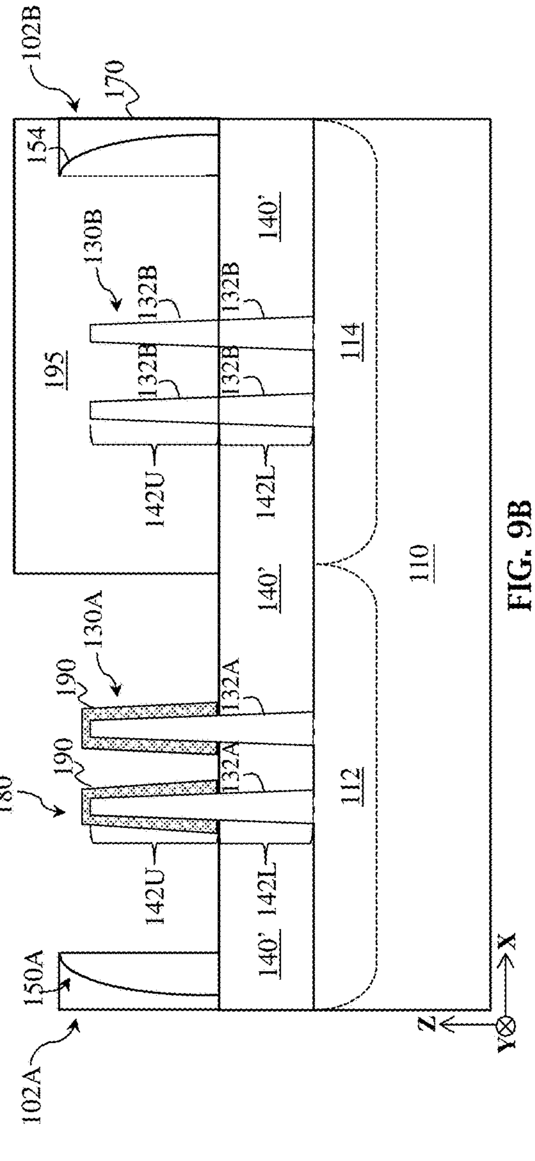

Turning to FIG. 9A and FIG. 9B, a channel capping layer 190 is formed over fins 132A in p-type FinFET device region 102A, such that channel capping layer 190 wraps upper fin active regions 142A of fins 132A. In the depicted embodiment, channel capping layer 190 includes silicon and germanium, and thus can be referred to as a silicon germanium capping layer. A concentration of germanium in channel capping layer 190 is less than a concentration of germanium in epitaxial source/drain features 160A. In some implementations, an atomic concentration of germanium in channel capping layer 190 is about 10% to about 30%, and an atomic concentration of germanium in epitaxial source/drain features 160A is about 30% to about 75%. A thickness of channel capping layer 190 is substantially uniform over fins 132A. For example, a thickness of channel capping layer 190 disposed over sidewalls of fins 132A is substantially equal to a thickness of channel capping layer 190 disposed over tops of fins 132A. In some implementations, a thickness of channel capping layer 190 is about 0.2 nm to about 2 nm. Because isolation features 140' surround lower fin active regions 142L of fins 132A, channel capping layer 190 is not formed over non-channel regions of fins 132A. In some implementations, a width of channel regions of the p-type FinFET in p-type FinFET region 102A is a sum of a width of fins 132A (in some implementations, about 1 nm to about 8 nm) and a thickness of channel capping layer 190 (in some implementations, about 0.2 nm to about 2 nm). In some implementations, after forming channel capping layer 190, the width of the channel regions of the p-type FinFET in p-type FinFET region 102A is about 3 nm to about 12 nm.

Channel capping layer 190 is formed by using a selective epitaxial growth process that can implement CVD deposition techniques (for example, VPE, UHV-CVD, LPCVD, and/or PECVD), molecular beam epitaxy, other suitable SEG processes, or combinations thereof. The SEG process can use gaseous and/or liquid precursors, which interact with the composition of fins 132A. In the depicted embodiment, the SEG process grows silicon germanium from silicon. In some implementations, channel capping layer 190 is doped with n-type dopants and/or p-type dopants during and/or after the SEG process. In some implementations, the SEG process may consume a portion of fins 132A, such that channel capping layer 190 is formed by consuming a portion of fins 132A. In such implementations, a portion of fins 132A may be converted into a portion of channel capping layer 190. The SEG process can be referred to as a selective deposition process, which generally refers to a deposition process having various parameters configured to selectively grow a semiconductor material from semiconductor surfaces (here, exposed surfaces of upper fin active regions 142U of fins 132A) while limiting (or preventing) growth of the semiconductor material from dielectric surfaces (here, surfaces of isolation features 140', ILD layer 170, and/or a blocking layer 195). For example, forming channel capping layer 190 includes tuning various parameters of a deposition process, such as a CVD-based SEG process, to selectively grow a silicon-and-germanium comprising material, from silicon-comprising surfaces of fins 132A while limiting (or preventing) growth of the silicon-and-germanium comprising material from isolation features 140', ILD layer 170, and/or a blocking layer 195. The various deposition parameters that can be tuned include deposition precursors (for example, semiconductor precursors and/or reactants), deposition precursor flow rates, deposition temperature, deposition time, deposition pressure, source power, radio frequency (RF) bias voltage, RF bias power, other suitable deposition parameters, or combinations thereof. In some implementations, the deposition process can include treating semiconductor surfaces and/or dielectric surfaces to achieve and/or enhance a deposition (or growth) rate of the semiconductor material on semiconductor surfaces that is greater than a deposition (or growth) rate of the semiconductor material on dielectric surfaces. In some implementations, channel capping layer 190 is formed by CVD, ALD, other suitable deposition process, or combinations thereof.

To prevent channel capping layer 190 from being formed in n-type FinFET region 102B, blocking (masking) layer 195 is formed over n-type FinFET region 102A before forming channel capping layer 190. Blocking layer 195 partially fills gate trench 180 of gate structure 150A and completely fills gate trenches 180 of gate structures 150D, 150E, such that blocking layer 195 covers fins 132B (in particular, upper fin active regions 142U and/or channel regions of fins 132B). Blocking layer 195 includes any material that can facilitate selective deposition of channel capping layer 190. In the depicted embodiment, blocking layer 195 includes a dielectric material, including, for example, silicon, oxygen, carbon, nitrogen, other suitable material, or combinations thereof (for example, silicon oxide, silicon nitride, silicon oxynitride, or silicon carbide). Blocking layer 195 is formed by any suitable process. In some implementations, blocking layer 195 is formed by depositing a dielectric layer over FinFET device 100; forming a patterned resist layer (or patterned mask layer) over the dielectric layer using a lithography process, where the patterned resist layer includes openings that expose the dielectric layer in p-type FinFET region 102A, and etching (removing) the exposed dielectric layer from p-type FinFET region 102A, such that the dielectric layer remains only in n-type FinFET region 102B; and removing the patterned resist layer. The dielectric layer can be deposited by CVD, FCVD, PVD, ALD, HDPCVD, MOCVD, RPCVD, PECVD, LPCVD, ALCVD, APCVD, plating, other suitable methods, or combinations thereof. The lithography process and the etching process can include any suitable process, such as those described herein. The present disclosure contemplates other combinations of deposition, lithography, and/or etching processes that can be implemented to form blocking layer 195. In some implementations, though not depicted, subsequent to the deposition of blocking layer 195, a CMP process and/or other planarization process is performed until reaching (exposing) top surfaces of ILD layer 170. After forming channel capping layer 190, blocking layer 195 is removed from gate trenches 180 in n-type FinFET region 102B, for example, by a selective etching process. In some implementations, an etching process is configured to etch a dielectric material (for example, silicon oxide, silicon nitride, or combinations thereof) without (or minimal) etching of a semiconductor material (for example, silicon, silicon germanium, germanium, or combinations thereof).

Figure 10A:
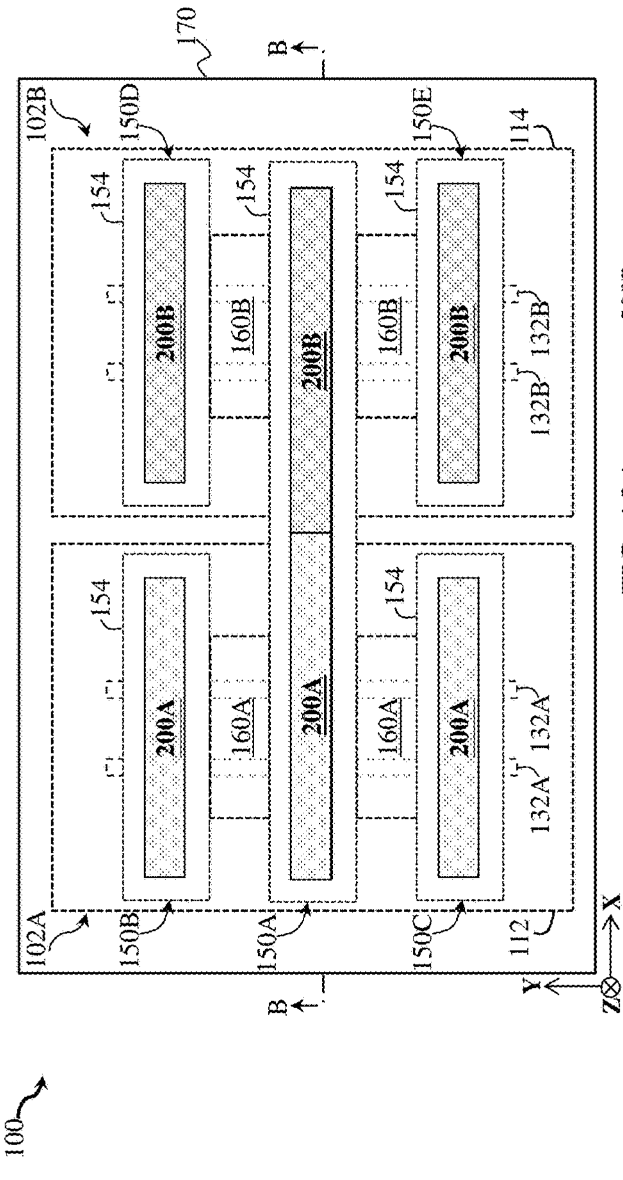
Figure 10B:
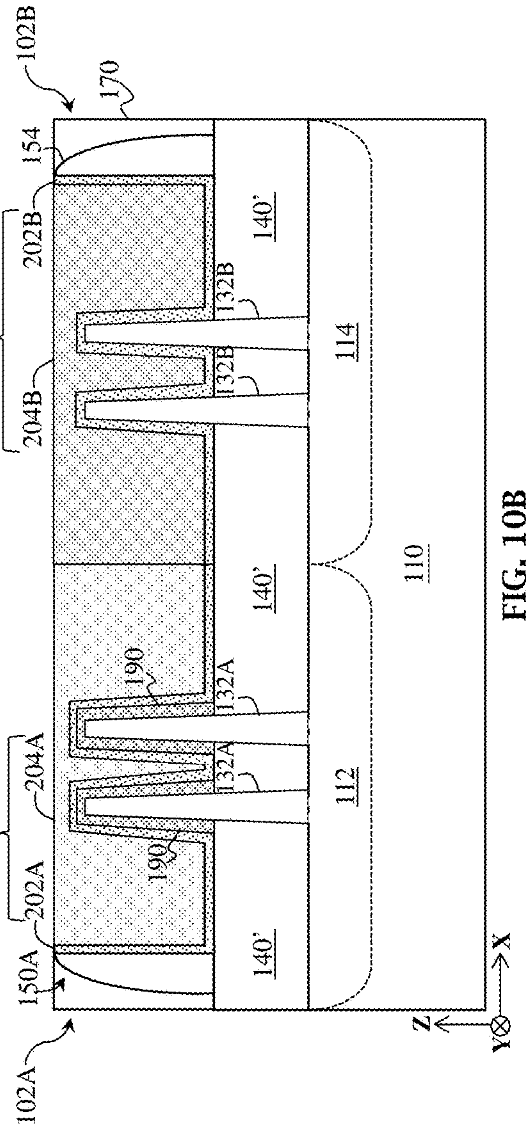
Figure 11A:
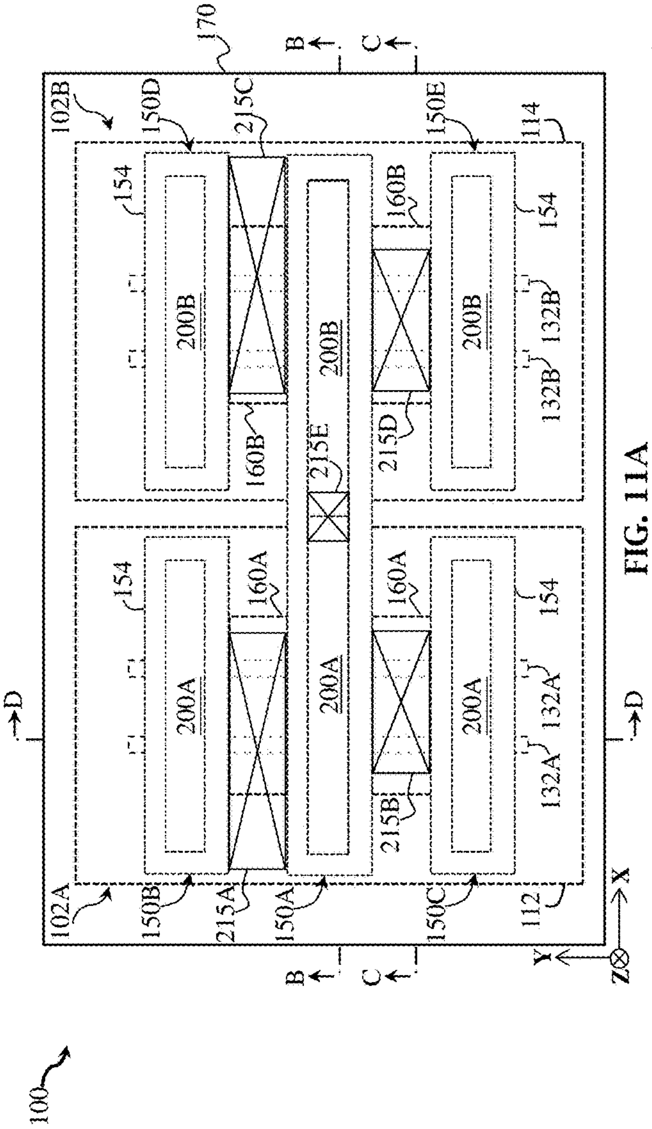
Figure 11B:
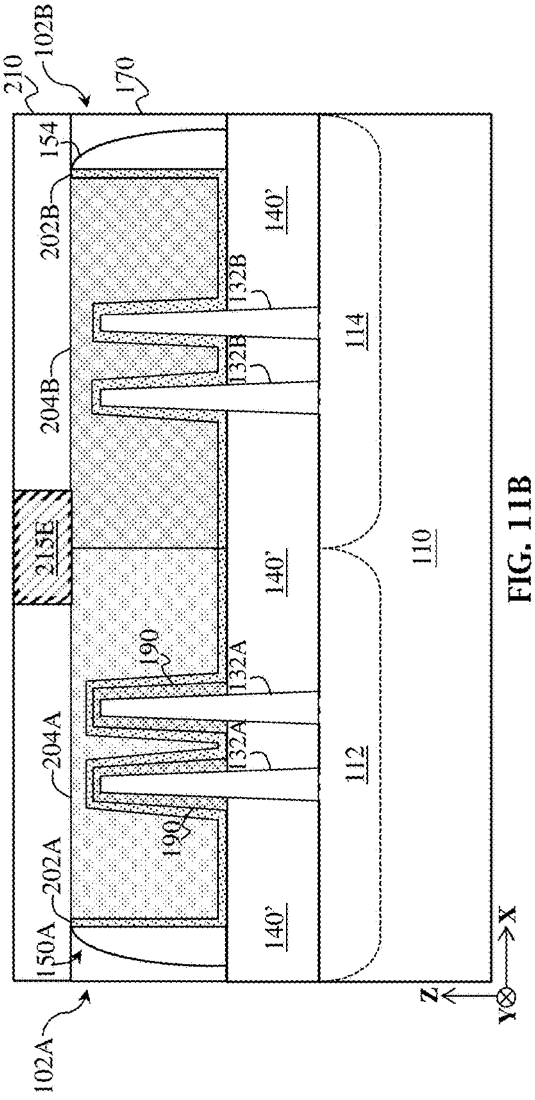
Figure 11C:
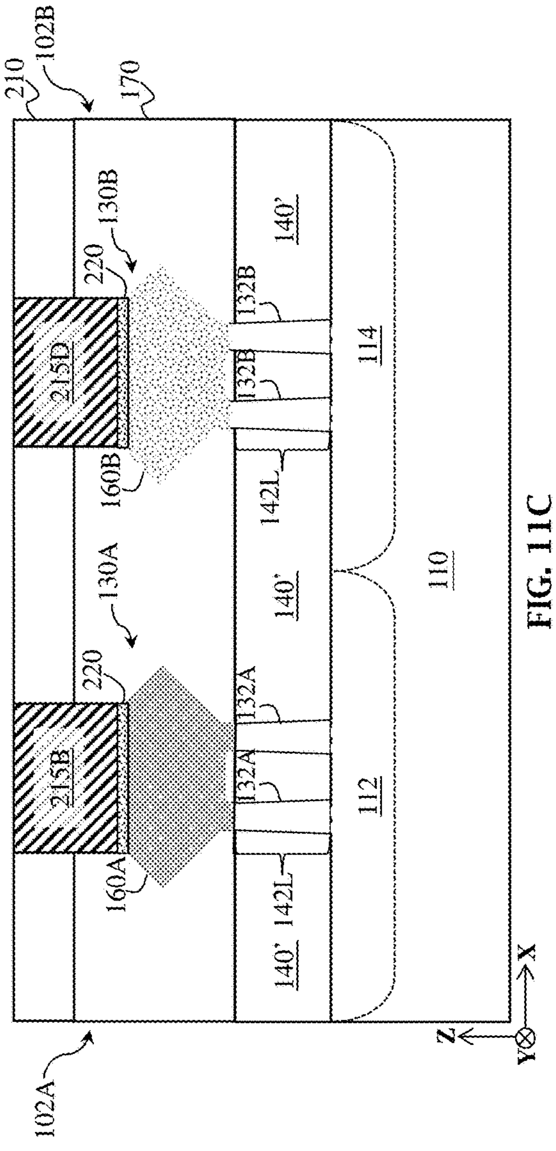
Figure 11D:
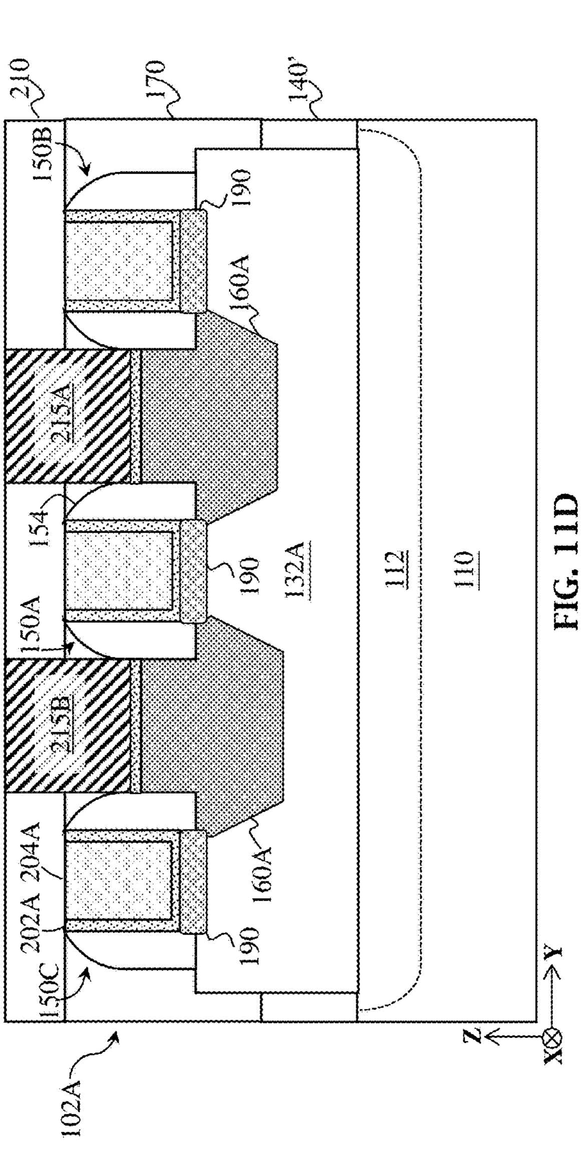
FIG. 11D is a fragmentary cross-sectional view of the FinFET device along line D-D of FIG. 11A according to various aspects of the present disclosure.

Turning to FIG. 10A and FIG. 10B, metal gates are formed in gate trenches 180, such as metal gates 200A formed in gate trenches 180 in p-type FinFET region 102A (here, gate trenches 180 of a portion of gate structures 150A, gate structure 150B, and gate structure 150C) and metal gates 200B formed in gate trenches 180 in n-type FinFET region 102B (here, gate trenches 180 of a portion of gate structure 150A, gate structure 150D, and gate structure 150E). Metal gates 200A include a gate dielectric 202A and a gate electrode 204A, and metal gates 200B include a gate dielectric 202B and a gate electrode 204B. Metal gates 200A, 200B are configured to achieve desired functionality according to design requirements of FinFET device 100, such that metal gates 200A, 200B include the same or different layers and/or materials. In the depicted embodiment, since channel capping layer 190 can alter a threshold voltage of the p-type FinFET in p-type FinFET region 102A (for example, by introducing desired strain to the channel region) relative to a threshold voltage of the n-type FinFET in n-type FinFET region 102B, metal gates 200A can be configured the same as metal gates 200B. For example, a number, configuration, and/or materials of layers of metal gates 200A are the same as a number, configuration, and/or materials of layers of metal gates 200B. In such implementations, gate dielectric 202A can be the same as gate dielectric 202B and/or gate electrode 204A can be the same as gate electrode 204B. In some implementations, gate electrode 204A and gate electrode 204B include the same work function layers, such that the p-type FinFET in p-type FinFET region 102A and the n-type FinFET in n-type FinFET region 102B have the same work function layers, but different threshold voltages because of channel capping layer 190. In alternative implementations, metal gates 200A are different than metal gates 200B to further tune threshold voltages of the p-type FinFET in p-type FinFET region 102A and the n-type FinFET in n-type region 102B. For example, a number, configuration, and/or materials of layers of metal gates 200A may be different than a number, configuration, and/or materials of layers of metal gates 200B. In such implementations, gate dielectric 202A can be different than gate dielectric 202B and/or gate electrode 204A can be different than gate electrode 204B. In furtherance of such implementations, metal gates 200A, 200B of gate structure 150A can share one or more layers, such that some layers of gate structure 150A extend continuously from metal gate 200A to metal gate 200B. In some implementations, one or more layers shared by metal gates 200A, 200B in gate structure 150A may be configured to achieve different characteristics.

Gate dielectric 202A wraps upper fin active regions 142U of fins 132A, and gate dielectric 202B wraps upper fin active regions 142U of fins 132B. In the depicted embodiment, in p-type FinFET region 102A, channel capping layer 190 is disposed between fins 132A and gate dielectric 202A. Gate dielectric 202A and gate dielectric 202B are conformally deposited over fins 132A, 132B and isolation features 140', such that gate dielectric 202A and gate dielectric 202B have substantially uniform thicknesses. In some implementations, a thickness of gate dielectric 202A and gate dielectric 202B is about 0.5 nm to about 3 nm. In some implementations, a thickness of gate dielectric 202A is substantially the same as a thickness of gate dielectric 202B. In some implementations, a thickness of gate dielectric 202A is different than a thickness of gate dielectric 202B. Gate dielectrics 202A, 202B include a dielectric material, such as silicon oxide, high-k dielectric material, other suitable dielectric material, or combinations thereof. In the depicted embodiment, gate dielectrics 202A, 202B include one or more high-k dielectric layers including, for example, hafnium, aluminum, zirconium, lanthanum, tantalum, titanium, yttrium, oxygen, nitrogen, other suitable constituent, or combinations thereof. In some implementations, the one or more high-k dielectric layers include $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. In some implementations, the high-k dielectric material has a dielectric constant greater than or equal to about five ($k \geq 5$). In some implementations, gate dielectrics 202A, 202B further include an interfacial layer (including a dielectric material, such as silicon oxide) disposed between the high-k dielectric layer and fins 132A, 132B and/or isolation features 140'. In some implementations, gate dielectrics 202A, 202B include a nitrogen-doped oxygen-containing dielectric layer and a high-k dielectric layer disposed over the nitrogen-doped oxygen-containing dielectric layer. In some implementations, gate dielectrics 202A, 202B are configured to tune work functions of the p-type FinFET in p-type FinFET region 102A and the n-type FinFET in n-type FinFET region 102B according to design requirements of FinFET device 100. Gate dielectrics 202A, 202B are formed by various processes, such as ALD, CVD, PVD, and/or other suitable process, such as described herein.

Gate electrodes 204A, 204B are respectively disposed over gate dielectrics 202A, 202B. Gate electrodes 204A, 204B include an electrically conductive material. In some implementations, gate electrodes 204A, 204B includes multiple layers, such as one or more capping layers, work function layers, glue/barrier layers, and/or metal fill (or bulk) layers. A capping layer can include a material that prevents or eliminates diffusion and/or reaction of constituents between gate dielectrics 202A, 202B and other layers of gate structures 150A-150E (in particular, gate layers including metal). In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. In some implementations, a hard mask layer (including, for example, silicon nitride or silicon carbide) is disposed over at least a portion of gate electrodes 204A, 204B. Gate electrodes 204A, 204B are formed by various deposition processes, such as ALD, CVD, PVD, and/or other suitable process, such as those described herein. A CMP process can be performed to remove any excess material of gate dielectrics 202A, 202B and/or gate electrodes 204A, 204B, planarizing gate structures 150A-150E.

Turning to FIGS. 11A-11D, FinFET device 100 can undergo further processing. In some implementations, various contacts of the MLI feature are formed to source/drain regions and/or gate structures of FinFET device 100 to facilitate operation of FinFET device 100. The MLI feature includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation of FinFET device 100, the interconnect features are configured to route signals between the devices (here, the p-type FinFET of p-type FinFET region 102A and the n-type FinFET of n-type FinFET region 102B) and/or the components of FinFET device 100 and/or distribute signals (for example, clock signals, voltage signals, and/or ground signals) to the devices and/or the components of FinFET device 100. The present disclosure contemplates the MLI feature including any number and/or configuration of dielectric layers and/or conductive layers depending on design requirements of FinFET device 100.

The MLI feature can include additional ILD layers formed over substrate 110. In the depicted embodiment, an ILD layer 210, which is a portion of the MLI feature, is disposed over ILD layer 170 and gate structures 150A-150E. ILD layer 210 is similar to ILD layer 170. In some implementations, ILD layer 210 is a first level ILD of the MLI feature (for example, ILD-1). In some implementations, a CESL is disposed between ILD layer 210 and ILD layer 170, which is similar to the CESLs described herein. In furtherance of the depicted embodiment, device-level contacts 215A-215E, vias (not shown), and conductive lines (not shown) (collectively referred to as a metal layer, such as a metal one (M1) layer, of the MLI feature) are disposed in the ILD layers of the MLI feature to form interconnect structures. Device-level contacts 215A-215E, vias, and conductive lines include any suitable electrically conductive material, such as Ta, Ti, Al, Cu, Co, W, TiN, TaN, other suitable conductive materials, or combinations thereof. Various conductive materials can be combined to provide device-level contacts 215A-215E, vias, and/or conductive lines with various layers, such as one or more barrier layers, adhesion layers, liner layers, bulk layers, other suitable layers, or combinations thereof. In some implementations, device-level-contacts 215A-215E include Ti, TiN, and/or Co; vias include Ti, TiN, and/or W; and conductive lines include Cu, Co, and/or Ru. Device-level contacts 215A-215E, vias, and conductive lines are formed by patterning ILD layer 170, ILD layer 210, and/or other ILD layers of the MLI feature. Patterning the ILD layers can include lithography processes and/or etching processes to form openings (trenches), such as contact openings, via openings, and/or line openings in respective ILD layers. In some implementations, the lithography processes include forming a resist layer over respective ILD layers, exposing the resist layer to patterned radiation, and developing the exposed resist layer, thereby forming a patterned resist layer that can be used as a masking element for etching opening(s) in respective ILD layers. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of the ILD layers (for example, ILD layer 210), device-level contacts 215A-215E, vias, and/or conductive lines.

Device-level contacts 215A-215E (also referred to as local interconnects or local contacts) electrically couple and/or physically couple IC device features, such as features of the p-type FinFET of p-type FinFET region 102A and the n-type FinFET of n-type FinFET region 102B to the MLI feature. For example, device-level contacts 215A-215D are metal-to-device (MD) contacts, which generally refer to contacts to a conductive region, such as source/drain regions, of FinFET device 100, and device-level contact 215E is a gate contact (CG) or metal-to-poly (MP) contact, which generally refers to a contact to a gate structure, such as a poly gate structure or a metal gate structure of FinFET device 100. In the depicted embodiment, device-level contacts 215A, 215B are disposed on respective epitaxial source/drain features 160A, such that device-level contacts 215A, 215B physically (or directly) connect the source/drain regions of the p-type FinFET of p-type FinFET region 102A to the MLI feature (for example, to respective vias); and device-level contacts 215C, 215D are disposed on respective epitaxial source/drain features 160B, such that device-level contacts 215C, 215D physically (or directly) connect the source/drain regions of the n-type FinFET of n-type FinFET region 102B to the MLI feature (for example, to respective vias). In furtherance of the depicted embodiment, device-level contact 215E is disposed on gate structure 150A, such that device-level contact 215E physically (or directly) connects gate structure 150A to the MLI feature (for example, to respective vias). In some implementations, the MLI feature includes vias that electrically couple and/or physically couple one or more of gate structures 150A-150E to the MLI feature. In such implementations, the vias are disposed on respective gate structures 150A-150E, such that the vias physically (or directly) connect respective gate structures 150A-150E to the MLI feature (for example, to respective conductive lines). Device-level contacts 215A-215E extend through ILD layer 210 and/or ILD layer 170, though the present disclosure contemplates embodiments where device-level contacts 215A-215E extend through more or less ILD layers and/or CESLs of the MLI feature. The present disclosure contemplates any configuration of device-level contacts, vias, and/or conductive lines.

In some implementations, silicide layers are disposed between epitaxial source/drain features 160A, 160B and device-level contacts 215A-215D. In some implementations, silicide layers 220 are formed by depositing a metal layer over epitaxial source/drain features 160A, 160B before or after forming ILD layer 170 and/or ILD layer 210. The metal layer includes any material suitable for promoting silicide formation, such as nickel, platinum, palladium, vanadium, titanium, cobalt, tantalum, ytterbium, zirconium, other suitable metal, or combinations thereof. FinFET device 100 is then heated (for example, subjected to an annealing process) to cause constituents of epitaxial source/drain features 160A, 160B (for example, silicon and/or germanium) to react with the metal. Silicide layers 220 thus include metal and a constituent of epitaxial source/drain features 160A, 160B (for example, silicon and/or germanium). In some implementations, silicide layers 220 include nickel silicide, titanium silicide, or cobalt silicide. Any un-reacted metal, such as remaining portions of the metal layer, is selectively removed by any suitable process, such as an etching process. In some implementations, silicide layers 220 and epitaxial source/drain features 160A, 160B are collectively referred to as the epitaxial source/drain features. In some implementations, silicide layers 220 are considered a portion of device-level contacts 215A-215D.

In FIGS. 11A-11D, FinFET device 100 includes a p-type FinFET in p-type FinFET region 102A that includes gate structure 150A disposed over a channel region of fins 132A, such that gate structure 150A is disposed between source/drain regions of fins 132A. Epitaxial source/drain features 160A are disposed over source/drain regions of fins 132A, and channel capping layer 190 is disposed over the channel region of fins 132A. In the depicted embodiments, fins 132A include silicon, epitaxial source/drain features 160A include silicon and germanium (in some implementations, further including boron dopant), and channel capping layer 190 includes silicon and germanium. FinFET device 100 further includes an n-type FinFET in n-type FinFET region 102B that includes gate structure 150A disposed over a channel region of fins 132B, such that gate structure 150A is disposed between source/drain regions of fins 132B. Epitaxial source/drain features 160B are disposed over source/drain regions of fins 132B, and channel capping layer 190 is not disposed over the channel region of fins 132B. In the depicted embodiments, fins 132B include silicon, and epitaxial source/drain features 160B include silicon. The p-type FinFET and the n-type FinFET thus form a complementary FinFET of FinFET device 100, where the p-type FinFET and the n-type FinFET both include silicon fins, such that the channel regions of the p-type FinFET includes silicon-based fin channel material. Forming channel capping layer 190 during the gate replacement process ensures that channel capping layer 190 exhibits desired strain characteristics for achieving a high mobility strained channel for the p-type FinFET, which further facilitates achieving desired threshold voltages for the p-type FinFET and the n-type FinFET without significant reliance on a number of layers and/or a thickness of layers of metal gates 200A, 200B. For example, in some implementations, because the p-type FinFET includes channel capping layer 190, metal gates 200A, 200B can include the same work function layers and/or materials, yet still exhibit threshold voltages that facilitate optimal performance (for example, a high voltage threshold and a low threshold voltage FinFET at the same time). In some implementations, the p-type FinFET and the n-type FinFET are a portion of a circuit, where gate structures 150B, 150C isolate the p-type FinFET from adjacent circuits of an IC device, and gate structures 150D, 150E isolate the n-type FinFET from adjacent circuits of the IC device. In some implementations, the p-type FinFET and the n-type FinFET are a portion of a memory cell for storing a bit of data of a memory array, such as static random access memory (SRAM) array, which often incorporates FinFETs to enhance performance. In some implementations, p-type FinFET is a FinFET in a core region of an IC device. In some implementations, channel capping layer 190 is included in p-type FinFETs in a core region of an IC device, but not in p-type FinFETs in an I/O region of the IC device to realize performance improvements. For example, in some implementations, by implementing channel capping layer 190 in p-type FinFETs of the core region, the present disclosure facilitates high speed-driven core logic circuits (for example, having on-off current ratios>about 10%) and high threshold voltage operation for I/O circuits (for example, having purely silicon channel without channel capping layer 190), which may be configured for low standby operation to facilitate reduced junction leakage and source-to-drain off current (Isoff). In some implementations, where the p-type FinFET and/or the n-type FinFET are in an I/O region of an IC device, a thickness of a gate dielectric of the p-type FinFET and/or the n-type FinFET is greater than a thickness of a gate dielectric of a p-type FinFET and/or an n-type FinFET in a core region of the IC device. In some implementations, where the p-type FinFET and/or the n-type FinFET are in a core region of an IC device, a thickness of a gate dielectric of the p-type FinFET and/or the n-type FinFET is less than a thickness of a gate dielectric of a p-type FinFET and/or an n-type FinFET in an I/O region of the IC device. Various processing is contemplated for achieving the different gate dielectric thicknesses.

The present disclosure contemplates variations in heights, widths, and/or lengths of fins 132A, 132B that may arise from processing and fabrication of FinFET device 100. For example, in the depicted embodiment, fins 132A, 132B have tapered widths along their respective heights, where the widths decrease along the heights of fins 132A, 132B. In some implementations, widths of fins 132A, 132B represent an average of a varying width of upper fin active regions 142U of fins 132A, 132B. In such implementations, widths decrease from a top surface of isolation features 140' to a top surface of fins 132A, 132B, such that the widths each represent an average of the decreasing widths of upper fin active regions 142U along their heights. In some implementations, the widths represent an average of a varying width of an entirety of respective fins 132A, 132B. In some implementations, the widths can vary from about 5 nm to about 15 nm along fins 132A, 132B depending on where the widths are measured along heights of fins 132A, 132B. In some implementations, fin width varies depending on a position of a fin relative to other fins and/or relative to other features of FinFET device 100. For example, widths of center fins may be greater than widths of edge fins. In another example, alternatively, widths of the center fins are less than widths of the edge fins. In furtherance of such implementations, respective widths of the edge fins and the center fins can represent respective average widths of the edge fins and the center fins in any manner as described herein. Though fins 132A, 132B are depicted as having tapered widths, in some implementations, fins 132A, 132B have substantially the same widths along their respective heights. In some implementations, a height (along the z-direction) of sidewalls of upper fin active regions 142U is about four times greater than a width (along the x-direction) of top surfaces of upper fin active regions 142U.

The present disclosure provides for many different embodiments. FinFETs having high mobility strained channels and methods of fabrication thereof are disclosed herein. An exemplary method includes forming a first silicon fin in a first type FinFET device region and a second silicon fin in a second type FinFET device region. First epitaxial source/drain features and second epitaxial source/drain features are formed respectively over first source/drain regions of the first silicon fin second source/drain regions of the second silicon fin. A gate replacement process is performed to form a gate structure over a first channel region of the first silicon fin and a second channel region of the second silicon fin. During the gate replacement process, a masking layer covers the second channel region of the second silicon fin when a silicon germanium channel capping layer is formed over the first channel region of the first silicon fin. In some implementations, the first epitaxial source/drain features include germanium and a concentration of the germanium of the first epitaxial source/drain features is greater than a concentration of the germanium of the silicon germanium channel capping layer. In some implementations, the method further includes forming an isolation feature that surrounds lower portions of the first silicon fin and the second silicon fin, where the dummy gate is formed after forming the isolation feature.

In some implementations, the method further includes, after removing the dummy gate, depositing a dielectric layer that fills the opening. A lithography and etching process is then performed to remove a portion of the dielectric layer from the opening in the first type FinFET device region, where a remaining portion of the dielectric layer is the masking layer. The remaining portion of the dielectric layer is removed before forming the metal gate. In some implementations, the remaining portion of the dielectric layer is removed by selectively etching the dielectric layer. In some implementations, the silicon germanium channel capping layer is formed by selectively depositing silicon germanium on silicon without depositing silicon germanium on a dielectric material. In some implementations, the silicon germanium channel capping layer is formed by converting a portion of the first silicon fin into a portion of the silicon germanium channel capping layer. In some implementations, the metal gate is formed by forming a first gate dielectric over the silicon germanium channel capping layer and a first gate electrode over the first gate dielectric in the first type FinFET device region, and forming a second gate dielectric over the second silicon fin and a second gate electrode over the second gate dielectric in the second type FinFET device region.

An exemplary integrated circuit device includes a first silicon fin in a first type FinFET device region and a second silicon fin in a second type FinFET device region. A gate structure is disposed over a first channel region of the first silicon fin and a second channel region of the second silicon fin, where the first channel region is disposed between first source/drain regions of the first silicon fin and the second channel region is disposed between second source/drain regions of the second silicon fin. A channel capping layer is disposed between the gate structure and the first channel region of the first silicon fin, wherein the channel capping layer includes silicon and germanium. In some implementations, an atomic concentration of germanium in the channel capping layer is about 10% to about 30%. In some implementations, a thickness of the channel capping layer is about 0.2 nm to about 2 nm.

In some implementations, the integrated circuit device further comprises first epitaxial source/drain features disposed over the first source/drain regions of the first silicon fin, wherein the first epitaxial source/drain features includes silicon and germanium and second epitaxial source/drain features disposed over the second source/drain regions of the second silicon fin, wherein the second epitaxial source/drain features include silicon. In some implementations, a concentration of the germanium of the first epitaxial source/drain features is greater than a concentration of the germanium of the channel capping layer. In some implementations, the concentration of the germanium of the first epitaxial source/drain features is about 30% to about 75% and the concentration of the germanium of the channel capping layer is about 10% to about 30%. In some implementations, the integrated circuit device further comprises an isolation feature that surrounds a portion of the first silicon fin and a portion of the second silicon fin, thereby defining the first channel region of the first silicon fin and the second channel region of the second silicon fin. The channel capping layer is not disposed between the isolation feature and the portion of the first silicon fin. In some implementations, the gate structure includes a first high-k dielectric layer and a first metal gate electrode disposed over the first channel region of the first silicon fin and a second high-k dielectric and a second metal gate electrode disposed over the second channel region of the second silicon fin.

Another integrated circuit device includes a first type FinFET having a first metal gate disposed over a portion of a first silicon fin, such that the first metal gate is disposed between a first silicon germanium epitaxial feature and a second silicon germanium epitaxial feature; a second type FinFET having a second metal gate disposed over a portion of a second silicon fin, such that the second metal gate is disposed between a first silicon epitaxial feature and a second silicon epitaxial feature; and a silicon germanium layer disposed between the first metal gate and the portion of the first silicon fin, such that the silicon germanium layer wraps the portion of the first silicon fin. In some implementations, a germanium concentration of the first silicon germanium epitaxial feature and the second silicon germanium epitaxial feature is greater than a germanium concentration of the silicon germanium layer. In some implementations, the first silicon germanium epitaxial feature and the second silicon germanium epitaxial feature further include boron. In some implementations, the portion of the first silicon fin and the portion of the second silicon fin are upper fin active regions, the integrated circuit device further comprising an isolation feature that surrounds a lower fin active region of the first silicon fin and a lower fin active region of the second silicon fin. In some implementations, the first type FinFET is a p-type FinFET and the second type FinFET is an n-type FinFET. In some implementations, the first metal gate and the second metal gate are a portion of a gate structure that traverses the first silicon fin and the second silicon fin, and further wherein the gate structure includes gate spacers disposed along sidewalls of the first metal gate and the second metal gate.

Another exemplary method includes forming a first silicon fin in a first type FinFET device region and a second silicon fin in a second type FinFET device region; forming a gate structure having a dummy gate over a first channel region of the first silicon fin and a second channel region of the second silicon fin; removing the dummy gate to form an opening that exposes the first channel region of the first silicon fin and the second channel region of the second silicon fin; forming a blocking layer that partially fills the opening and covers the second channel region of the second silicon fin; forming a silicon germanium channel capping layer over the first channel region of the first silicon fin; removing the blocking layer from the opening; and forming a metal gate in the opening over the silicon germanium channel capping layer and the second silicon fin. In some implementations, the method further includes forming first epitaxial source/drain features over first source/drain regions of the first silicon fin and second epitaxial source/drain features over second source/drain regions of the second silicon fin, wherein the first epitaxial source/drain features include silicon and germanium. In some implementations, the silicon germanium channel capping layer is formed by performing a selective deposition process. In some implementations, before forming the gate structure, the method further includes forming isolation features that define the first channel region of the first silicon fin and the second channel region of the second silicon fin. In some implementations, the blocking layer is formed by depositing a dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first silicon fin in a first type Fin-Like Field Effect Transistor (FinFET) device region and a second silicon fin in a second type FinFET device region;

forming first epitaxial source/drain features over first source/drain regions of the first silicon fin and second epitaxial source/drain features over second source/drain regions of the second silicon fin; and performing a gate replacement process to form a gate structure over a first channel region of the first silicon fin and a second channel region of the second silicon fin, such that the gate structure is disposed between the first source/drain regions of the first silicon fin and the second source/drain regions of the second silicon fin, wherein the gate replacement process includes:

forming a dummy gate over the first channel region of the first silicon fin and the second channel region of the second silicon fin before forming the first epitaxial source/drain features and the second epitaxial source/drain features, removing the dummy gate to form an opening that exposes the first channel region of the first silicon fin and the second channel region of the second silicon fin after forming the first epitaxial source/drain features and the second epitaxial source/drain features, forming a silicon germanium channel capping layer over the first channel region of the first silicon fin, wherein the second channel region of the second silicon fin is covered by a masking layer during the forming of the silicon germanium channel capping layer, and forming a metal gate in the opening, wherein the metal gate is disposed over the silicon germanium channel capping layer and the second silicon fin.

2. The method of claim 1, further comprising:

after removing the dummy gate, depositing a dielectric layer that fills the opening;

performing a lithography and etching process to remove a portion of the dielectric layer from the opening in the first type FinFET device region, wherein a remaining portion of the dielectric layer is the masking layer; and removing the remaining portion of the dielectric layer before forming the metal gate.

3. The method of claim 2, wherein the removing the remaining portion of the dielectric layer includes selectively etching the dielectric layer.

4. The method of claim 1, wherein the forming the silicon germanium channel capping layer includes selectively depositing silicon germanium on silicon without depositing silicon germanium on a dielectric material.

5. The method of claim 1, further comprising forming an isolation feature that surrounds lower portions of the first silicon fin and the second silicon fin, wherein the dummy gate is formed after forming the isolation feature.

6. The method of claim 1, wherein the forming the metal gate includes:

forming a first gate dielectric over the silicon germanium channel capping layer and a first gate electrode over the first gate dielectric in the first type FinFET device region; and forming a second gate dielectric over the second silicon fin and a second gate electrode over the second gate dielectric in the second type FinFET device region.

7. The method of claim 1, wherein the forming the silicon germanium channel capping layer includes converting a portion of the first silicon fin into a portion of the silicon germanium channel capping layer.

8. The method of claim 1, wherein the first epitaxial source/drain features include germanium and a concentration of the germanium of the first epitaxial source/drain features is greater than a concentration of the germanium of the silicon germanium channel capping layer.

9. A method comprising:

forming a first silicon fin in a first type Fin-Like Field Effect Transistor (FinFET) device region and a second silicon fin in a second type FinFET device region;

forming a gate structure having a dummy gate over a first channel region of the first silicon fin and a second channel region of the second silicon fin;

removing the dummy gate to form an opening that exposes the first channel region of the first silicon fin and the second channel region of the second silicon fin;

forming a blocking layer that partially fills the opening and covers the second channel region of the second silicon fin;

forming a silicon germanium channel capping layer over the first channel region of the first silicon fin;

removing the blocking layer from the opening; and forming a metal gate in the opening over the silicon germanium channel capping layer and the second silicon fin.

10. The method of claim 9, further comprising forming first epitaxial source/drain features over first source/drain regions of the first silicon fin and second epitaxial source/drain features over second source/drain regions of the second silicon fin, wherein the first epitaxial source/drain features include silicon and germanium.

11. The method of claim 9, wherein the forming the silicon germanium channel capping layer includes performing a selective deposition process.

12. The method of claim 11, wherein the performing the selective deposition process includes depositing silicon germanium material on silicon without depositing silicon germanium on silicon oxide, silicon nitride, or combinations thereof.

13. The method of claim 9, wherein before forming the gate structure, the method further comprises forming isolation features that define the first channel region of the first silicon fin and the second channel region of the second silicon fin.

14. The method of claim 13, wherein the forming the isolation features includes:

depositing a dielectric layer over the first silicon fin and the second silicon fin; and etching back the dielectric layer to define the first channel region of the first silicon fin and the second channel region of the second silicon fin.

15. The method of claim 9, wherein the forming the blocking layer includes depositing a dielectric layer.

16. A method comprising:

forming a first fin in a first type Fin-Like Field Effect Transistor (FinFET) device region and a second fin in a second type FinFET device region;

forming an isolation feature surrounding a lower portion of the first fin and a lower portion of the second fin;

forming a dummy gate over a first channel region of the first fin and a second channel region of the second fin;

removing the dummy gate to form an opening that exposes the first channel region of the first fin and the second channel region of the second fin;

forming a channel capping layer over the first channel region and wrapping an upper portion of the first fin, wherein the channel capping layer includes silicon and germanium and is not disposed over the second channel region of the second fin; and forming a metal gate in the opening over the channel capping layer and the second fin.

17. The method of claim 16, further comprising:

forming a first epitaxial source/drain feature over a first source/drain region of the first fin and a second epitaxial source/drain feature over a second source/drain region of the second fin, wherein the first epitaxial source/drain feature includes silicon and germanium and a concentration of the germanium of the first epitaxial source/drain feature is greater than a concentration of the germanium of the channel capping layer.

18. The method of claim 16, wherein the forming the channel capping layer includes selectively epitaxial growing silicon germanium from the first fin without depositing silicon germanium on a dielectric material.

19. The method of claim 18, wherein the forming the channel capping layer includes doping the channel capping layer during selectively epitaxial growing silicon germanium.

20. The method of claim 16, wherein the forming the channel capping layer includes forming the channel capping layer conformally wrapping the upper portion of the first fin.

* * * * *